US012711999B2

(12) United States Patent
Jo et al.

(10) Patent No.: US 12,711,999 B2
(45) Date of Patent: Aug. 18, 2026

(54) NON-VOLATILE MEMORY DEVICE, STORAGE DEVICE INCLUDING THE SAME DEVICE, AND METHOD OF OPERATING THE SAME STORAGE DEVICE

(71) Applicant: Samsung Electronics Co., Ltd., Suwon-si (KR)

(72) Inventors: Daehyeon Jo, Suwon-si (KR); Kyungduk Lee, Suwon-si (KR); Youn-Soo Cheon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 118 days.

(21) Appl. No.: 18/749,743

(22) Filed: Jun. 21, 2024

(65) Prior Publication Data

US 2025/0166670 A1 May 22, 2025

(30) Foreign Application Priority Data

Nov. 16, 2023 (KR) ........................ 10-2023-0159085

(51) Int. Cl.
*G11C 7/02* (2006.01)
*G11C 7/10* (2006.01)

(52) U.S. Cl.
CPC .............. *G11C 7/02* (2013.01); *G11C 7/1063* (2013.01); *G11C 7/1069* (2013.01)

(58) Field of Classification Search
CPC ........ G11C 7/02; G11C 7/1063; G11C 7/1069
See application file for complete search history.

(56) References Cited

U.S. PATENT DOCUMENTS

| | | | | |
|---|---|---|---|---|
| 10,379,926 | B2 | 8/2019 | Chang et al. | |
| 11,133,083 | B1 * | 9/2021 | Fitzpatrick | G11C 7/04 |
| 11,372,593 | B2 | 6/2022 | Lee et al. | |
| 11,422,717 | B2 | 8/2022 | Hsieh | |
| 11,579,988 | B2 | 2/2023 | Richter et al. | |
| 11,705,172 | B2 | 7/2023 | Chang et al. | |
| 2013/0173971 | A1 | 7/2013 | Zimmerman | |
| 2016/0041861 | A1 | 2/2016 | Chang et al. | |
| 2016/0042773 | A1 * | 2/2016 | Cho | G11C 7/22 365/191 |
| 2019/0214098 | A1 | 7/2019 | Arakawa | |
| 2021/0081118 | A1 | 3/2021 | Hsieh | |
| 2021/0391000 | A1 | 12/2021 | Lee et al. | |
| 2022/0004466 | A1 | 1/2022 | Richter et al. | |

(Continued)

FOREIGN PATENT DOCUMENTS

KR 10-2022-0008428 A 1/2022

OTHER PUBLICATIONS

European Search Report dated Mar. 25, 2025 issued in European Patent Application No. 24208007.5 -1211.

*Primary Examiner* — Han Yang
(74) *Attorney, Agent, or Firm* — Fish & Richardson P.C.

(57) ABSTRACT

A non-volatile memory device, a storage device including the non-volatile memory device, and an operating method of the storage device are provided. The non-volatile memory device comprises a data pin configured to output a data signal, and a command address pin being separate from the data pi the command address pin configured to receive a read command corresponding to the data signal and output a noise state data during a data output operation in which the data signal is output through the data pin in response to the read command.

20 Claims, 21 Drawing Sheets

(56) References Cited

U.S. PATENT DOCUMENTS

| | | | | |
|---|---|---|---|---|
| 2022/0011974 | A1 | 1/2022 | Lee et al. | |
| 2022/0137863 | A1 | 5/2022 | Schafer | |
| 2022/0392503 | A1 | 12/2022 | Chang et al. | |
| 2023/0061144 | A1 | 3/2023 | Schaefer | |
| 2024/0170080 | A1* | 5/2024 | Choi | G06F 3/0658 |

* cited by examiner

Figure 1:
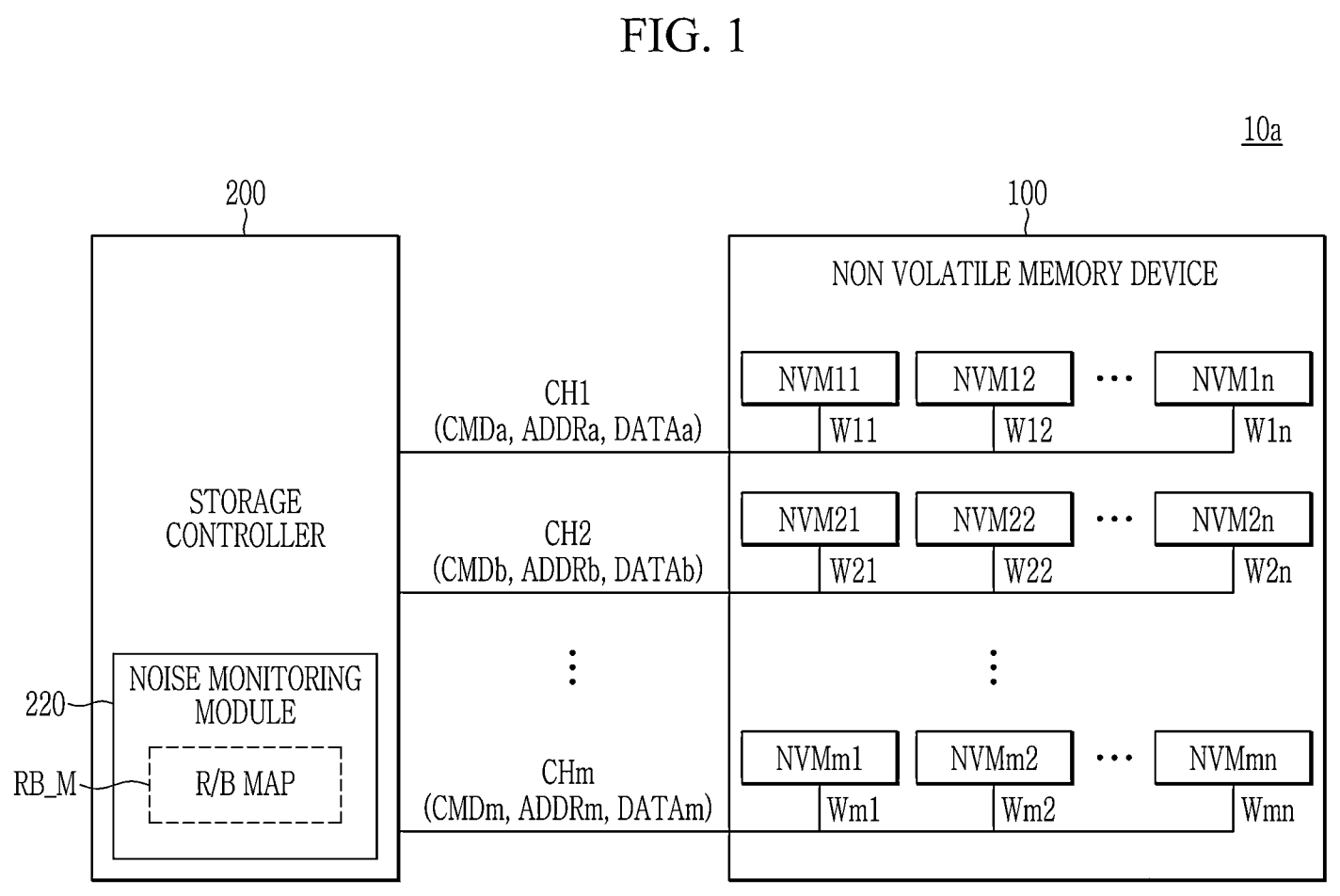

NON VOLATILE MEMORY DEVICE

NVM11 W11
NVM12 W12
NVM1n W1n
NVM21 W21
NVM22 W22
NVM2n W2n
NVMm1 Wm1
NVMm2 Wm2
NVMmn Wmn

CH1 (CMDa, ADDRa, DATAa)
CH2 (CMDb, ADDRb, DATAb)
CHm (CMDm, ADDRm, DATAm)

200

STORAGE CONTROLLER

NOISE MONITORING MODULE

R/B MAP

W11
Ready

W12
NandBusy

W13
IO

W1n
NandBusy

Wmn
NandBusy

CH1

CHm 10a
100
NON VOLATILE MEMORY
120
CONTROL LOGIC
130
MEMORY CELL ARRAY
CMD/ADDR
NSD, RBSD
DATA
110
MEMORY I/F
P11
P12
P13
P14
P15
P16
P17
CA(NSD, RBSD)
CA(NSD, RBSD)
DQ
CA_CLK
nRE
DQS
CA_CE
P21
P22
P23
P24
P25
P26
P27
200
STORAGE CONTROLLER
210
CONTROLLER I/F

| IO Bit | [7] | [6] | [5] | [4] | [3] | [2] | [1] | [0] |
|---|---|---|---|---|---|---|---|---|
| Info | CNSD1 | | | | VNSD1 | | | FB1 |

NSD1

FIG. 12

(V)
T
Vcc1
Vcc_ref1
Vcc_ref2
Vcc_ref3
Vcc_ref4
Vcc_ref5(Vth)
Vcc_ref6
Vcc_ref7
tc
td
tm2

FIG. 17

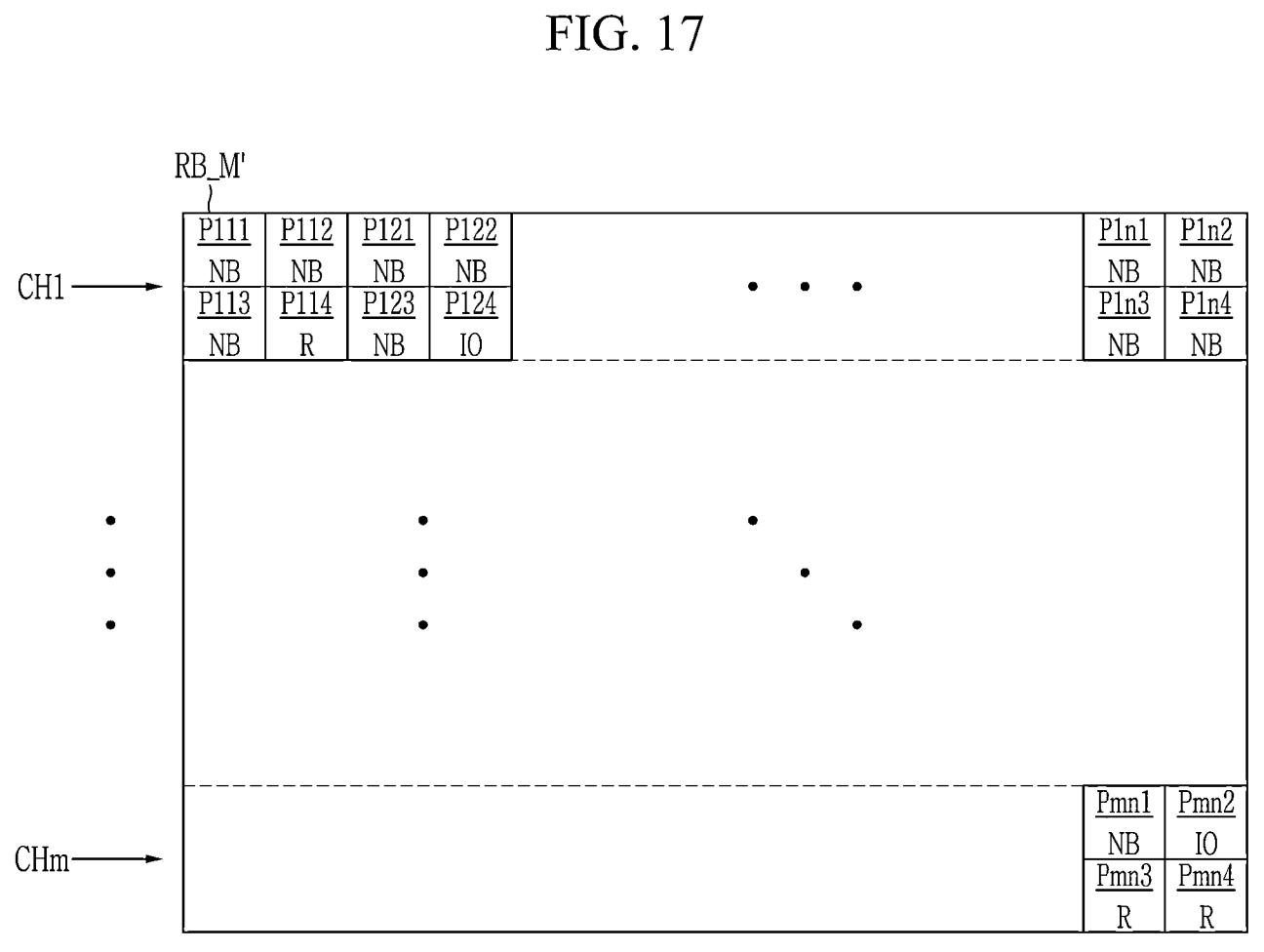

RB_M'
CH1
CHm
P111 NB
P112 NB
P113 NB
P114 R
P121 NB
P122 NB
P123 NB
P124 IO
P1n1 NB
P1n2 NB
P1n3 NB
P1n4 NB
Pmn1 NB
Pmn2 IO
Pmn3 R
Pmn4 R

CHm

| P111 NB | P112 NB | P121 NB | P122 NB | ... | P1n1 NB | P1n2 NB |
|---|---|---|---|---|---|---|
| P113 NB | P114 NB | P123 NB | P124 IO | ... | P1n3 NB | P1n4 NB |
| ... | | | | ... | | |
| | | | | ... | Pmn1 NB | Pmn2 IO |
| | | | | | Pmn3 R | Pmn4 R |

FIG. 21

NON-VOLATILE MEMORY DEVICE, STORAGE DEVICE INCLUDING THE SAME DEVICE, AND METHOD OF OPERATING THE SAME STORAGE DEVICE

CROSS-REFERENCE TO RELATED APPLICATION

This application claims priority to and the benefit of Korean Patent Application No. 10-2023-0159085 filed in the Korean Intellectual Property Office on Nov. 16, 2023, the entire contents of which are incorporated herein by reference.

BACKGROUND

(a) Field

The present disclosure relates to non-volatile memory devices, storage devices including such non-volatile memory devices, and a method of operating such storage devices.

(b) Description of the Related Art

As the processing speed of data that electronic devices increases, storage devices capable of high-speed input/output and low electric power are required. To achieve the above high-speed input/output and low electric power, various technologies are being researched.

However, due to higher speed and lower electric power, the signal integrity (SI) characteristic of a data signal input/output to a storage device is degraded, and a data input/output (IO) operation is becoming more vulnerable to noise. As a result, the data reliability of storage device is impaired, and thus there is a need to efficiently detect noise in data input/output operations.

SUMMARY

The present disclosure attempts to provide non-volatile memory devices, storage devices including the same device, and methods of operating such storage devices.

An example embodiment provides a non-volatile memory device that efficiently performs noise detection in noise-vulnerable conditions.

An example embodiment provides a non-volatile memory device that improves the overhead of overlapping noise monitoring operation and data input/output operation.

According to an example embodiment, a non-volatile memory device includes a data pin configured to output a data signal and a command address pin being separate from the data pin the command address pin configured to receive a read command corresponding to the data signal and output a noise state data during a data output operation in which the data signal is output through the data pin in response to the read command.

According to an example embodiment, a storage device includes a first non-volatile memory device and a second non-volatile memory device connected to a first channel, the first non-volatile memory device and the second non-volatile memory device configured to perform a data input/output operation through the first channel and a storage controller configured to provide a data input/output command for the data input/output operation to the first non-volatile memory device through a command address pin connected to the first channel, perform the data input/output operation for the first non-volatile memory device through a data pin connected to the first channel that is different from the command address pin, and receive a noise state data on at least one of the first and the second non-volatile memory devices in parallel with the data input/output operation through the command address pin.

According to an example embodiment, an operation method of a storage device includes providing a data input/output command through a command address pin, performing a data input/output operation through a data pin different from the command address pin based on the data input/output command, providing a noise monitoring command through the command address pin according to a condition during the data input/output operation, and receiving a noise state data through the command address pin in response to the noise monitoring command.

BRIEF DESCRIPTION OF THE DRAWINGS

FIG. 1 is a block diagram showing a storage device according to an example embodiment.

FIG. 2 is a drawing to explain a ready/busy map of FIG. 1.

FIG. 11 and FIG. 12 are drawings to explain a voltage noise detection unit according to an example embodiment.

FIG. 17 is a drawing to explain a storage device according to an embodiment.

FIG. 18 and FIG. 19 are drawings to explain an operation of a storage device according to an example embodiment.

FIG. 21 is a block diagram showing an SSD system to which a storage device is applied according to an example embodiment.

DETAILED DESCRIPTION

Figure 3:
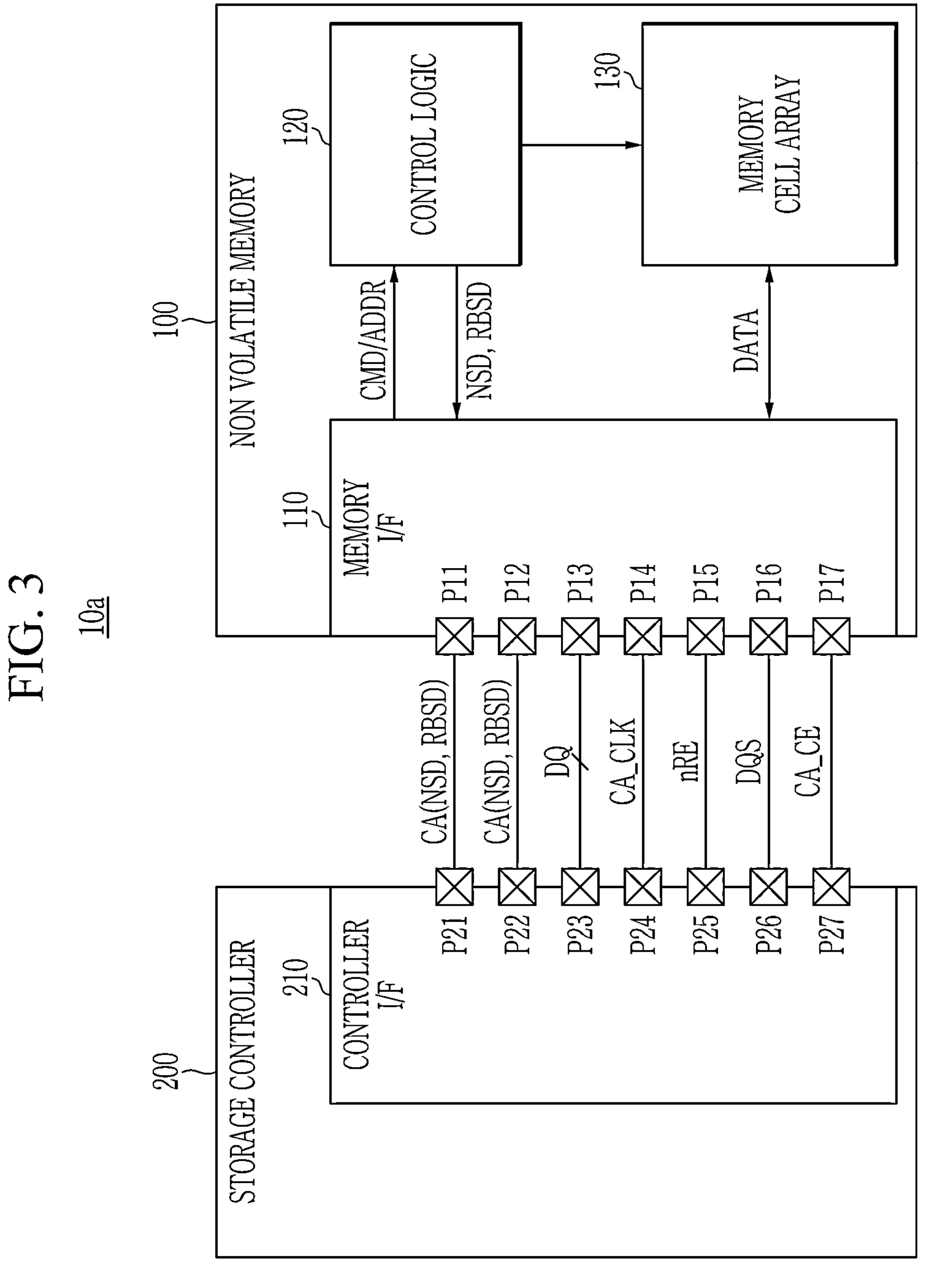
FIG. 3 is a drawing to explain a storage device according to an example embodiment.

Hereinafter, with reference to the accompanying drawings, several example embodiments of the present inventive concepts will be described in detail so that a person of an ordinary skill can easily practice it in the technical field to which the present inventive concepts belong. The present inventive concepts may be implemented in several different forms and is not limited to the example embodiments described herein.

To clearly explain the present inventive concepts, parts that do not have a relationship with the explanation are omitted, and throughout the specification, identical or similar components are assigned the same reference numerals.

In addition, the size and thickness of each component shown in the drawing are arbitrarily shown for better understanding and ease of description, so the present inventive concepts are not necessarily limited to what is shown. In the drawings, the thickness of layers, films, panels, regions, etc., are exaggerated for clarity. In addition, in the drawing, the thickness of some layers and regions is exaggerated for better understanding and ease of description.

In addition, throughout the specification, unless explicitly described to the contrary, the word "comprise", and variations such as "comprises" or "comprising", will be understood to imply the inclusion of stated elements but not the exclusion of any other elements.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the term "about," "substantially" or "approximately" is used in this specification in connection with a numerical value, it is intended that the associated numerical value includes a manufacturing or operational tolerance (e.g., ±10%) around the stated numerical value. Moreover, when the word "about," "substantially" or "approximately" is used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 2:
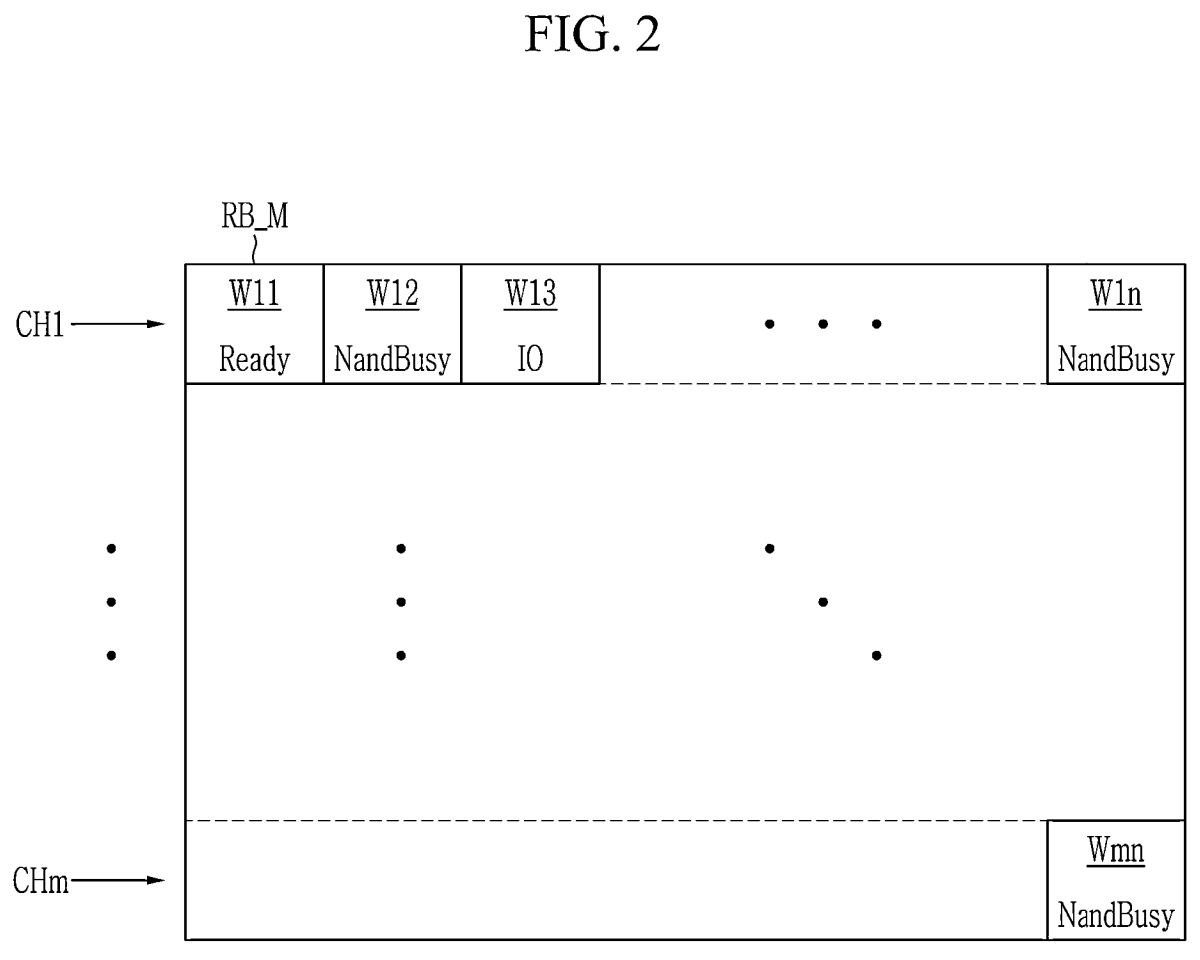

FIG. 1 is a block diagram showing a storage device according to an example embodiment. FIG. 2 is a drawing to explain a ready/busy map of FIG. 1.

Referring to FIG. 1 and FIG. 2, a storage device 10*a* may include a non-volatile memory device 100 and a storage controller 200. The storage device 10*a* may support plurality of channels CH1 to CHm, and the non-volatile memory device 100 and the storage controller 200 may be connected through the plurality of channels CH1 to CHm. For example, the storage device 10*a* may be implemented as a storage device such as a solid state drive (SSD).

The non-volatile memory device 100 may include a plurality of non-volatile memory devices NVM11 to NVMmn. Each of the plurality of non-volatile memory devices NVM11 to NVMmn may be connected to one of the plurality of channels CH1 to CHm through a corresponding way. For example, non-volatile memory devices NVM11 to NVM1*n* may be connected to a first channel CH1 through ways W11-W1*n*, and the non-volatile memory devices NVM21 to NVM2*n* may be connected to a second channel CH1 through ways W21 to W2*n*. In an example embodiment, each of the non-volatile memory devices NVM11 to NVMmn may be implemented as an arbitrary memory unit capable of operating according to an individual control signal from the storage controller 200. For example, each of the non-volatile memory device NVM11 to NVMmn may be implemented as a chip or die, but the present inventive concepts are not limited thereto.

The storage controller 200 may include a noise monitoring module 220. The noise monitoring module 220 may perform a noise monitoring operation on the non-volatile memory device NVM11 to NVMmn when a desired (or alternatively, predetermined) condition is satisfied based on a ready/busy map RB_M. The ready/busy map RB_M according to an example embodiment may include ready/busy state data for each of the non-volatile memory devices NVM11-NVMmn in a bitmap format. The storage controller 200 according to the example embodiment may check an operating state of the non-volatile memory devices NVM11 to NVMmn through the ready/busy map RB_M.

According to an example embodiment, a desired (or alternatively, predetermined) condition may be a condition vulnerable to noise in which various configurations are interleaving each other, but is not limited thereto. The storage controller 200 according to an example embodiment may provide a noise monitoring command when a condition vulnerable to noise is satisfied and may efficiently detect noise by receiving the stored noise state data. The detailed description of the desired (or alternatively, predetermined) condition will be described later.

The noise monitoring module 220 may provide an update command at a desired (or alternatively, predetermined) cycle to the plurality of non-volatile memory devices NVM11 to NVMmn and may receive a ready/busy state data RBSD of FIG. 3 from the plurality of non-volatile memory devices NVM11 to NVMmn to update the pre-stored ready/busy map RB_M.

The ready/busy state data RBSD according to an example embodiment may include a ready state, a busy state, and an input/output state. When the ready/busy state data RBSD is in a ready state, it may correspond to a case where an internal operation of the non-volatile memory devices NVM11 to NVMmn (e.g., program, read, erase, etc. for memory cells) is not performed or has been completed. When the ready/busy state data is in a busy state, it may correspond to a case where internal operations in a memory device 300 of the non-volatile memory devices NVM11 to NVMmn are being performed. When the ready/busy state data is in an input/output state, it may correspond to a case where the non-volatile memory device NVM11 to NVMmn performs input/output operation such as a case where the non-volatile memory devices NVM11 to NVMmn receives the input data to be programmed, or the non-volatile memory devices NVM11 to NVMmn outputs the read data, etc.

Referring to FIG. 2, through the ready/busy map RB_M, the storage controller 200 may see that a 1_1 non-volatile memory device NVM11 corresponding to a 1_1 way W11 in the first channel CH1 is in a ready state, a 1_2 non-volatile memory device NVM12 corresponding to a 1_2 way W12 and a 1_n non-volatile memory device NVM1*n* corresponding to a 1_n way W1*n* are in a busy state, and a 1_3 non-volatile memory device NVM13 corresponding to a 1_3 way W13 is in an input/output state. In addition, the storage controller 200, through the ready/busy map RB_M, may confirm whether an m_nth non-volatile memory device NVMmn corresponding to an m_nth way Wmn in an nth channel CHn is in a busy state.

The storage controller 200 may transceive signals with a non-volatile memory device 100 through plurality of channels CH1 to CHm. For example, the storage controller 200 may transmit commands CMDa to CMDm, addresses ADDRa to ADDRm and data DATAa to DATAm to the non-volatile memory device 100 through channels CH1 to CHm, and may receive the data DATAa to DATAm and state data from non-volatile memory device 100.

The storage controller 200 may select one of the non-volatile memory devices connected to a corresponding channel through each channel, and may transceive signals with the selected non-volatile memory device. For example, the storage controller 200 may select the non-volatile memory device NVM11 among the non-volatile memory devices NVM11 to NVM1*n* connected to the first channel CH1. The storage controller 200 may transmit a command CMDa, an address ADDRa, and a data DATAa to the selected non-volatile memory device NVM11 through first channel CH1 to receive the data DATAa from the selected non-volatile memory device NVM11.

The storage controller 200 may transceive signals in parallel with the non-volatile memory device 100 through different channels. For example, the storage controller 200 may transmit a command CMDb to the non-volatile memory device 100 through a second channel CH2 while transmitting a command CMDa to the non-volatile memory device 100 through the first channel CH1. For example, the storage controller 200 may receive the data DATAb from the non-volatile memory device 100 through the second channel CH2 while receiving the data DATAa from the non-volatile memory device 100 through the first channel CH1.

The storage controller 200 may control an overall operation of the non-volatile memory device 100. The storage controller 200 may transmit a signal to the channels CH1 to CHm to control each of the non-volatile memory devices NVM11 to NVMmn connected to the channels CH1 to CHm. For example, the storage controller 200 may transmit a command (CMDa) and an address ADDRa to a first channel CH1 to control a selected one of the non-volatile memory devices NVM11 to NVM1*n*.

Each of the non-volatile memory devices NVM11 to NVMmn may operate under the control of the storage controller 200. For example, the non-volatile memory device NVM11 may program a data DATAa according to the command CMDa, the address ADDRa, and the data DATAa provided to the first channel CH1. For example, the non-volatile memory device NVM21 may read the data DATAb according to the command CMDb and the address ADDRb provided to a second channel CH2, and may transmit the read data DATAb to the storage controller 200.

In FIG. 1, the non-volatile memory device 100 may communicate with the storage controller 200 through m channels, and although the non-volatile memory device 100 is shown as including n non-volatile memory devices corresponding to respective channels, the number of channels and the number of non-volatile memory devices connected to one channel may be changed in various manners.

Figure 4:
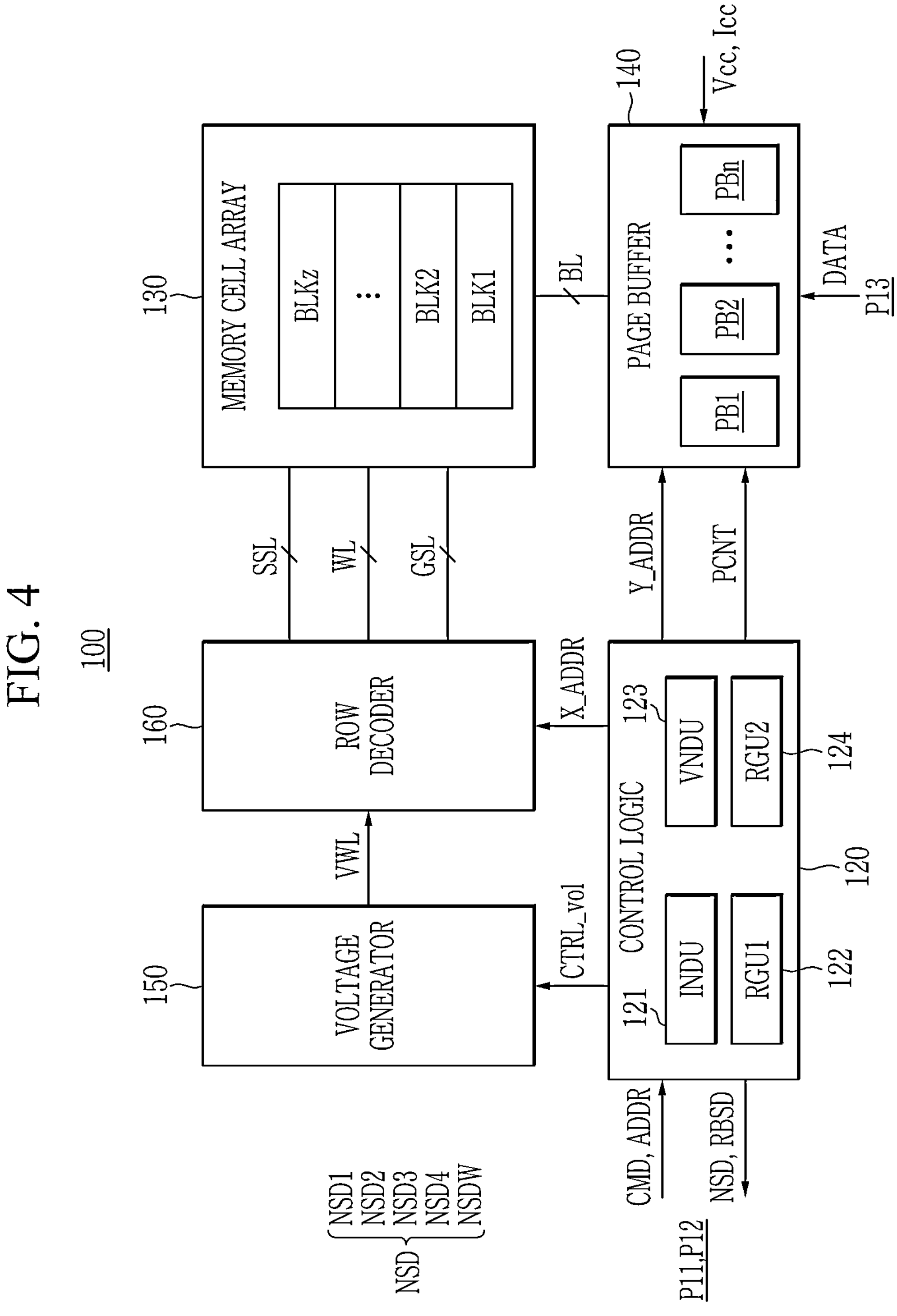
FIG. 4 is a block diagram showing a non-volatile memory device according to an example embodiment.
Figure 5:
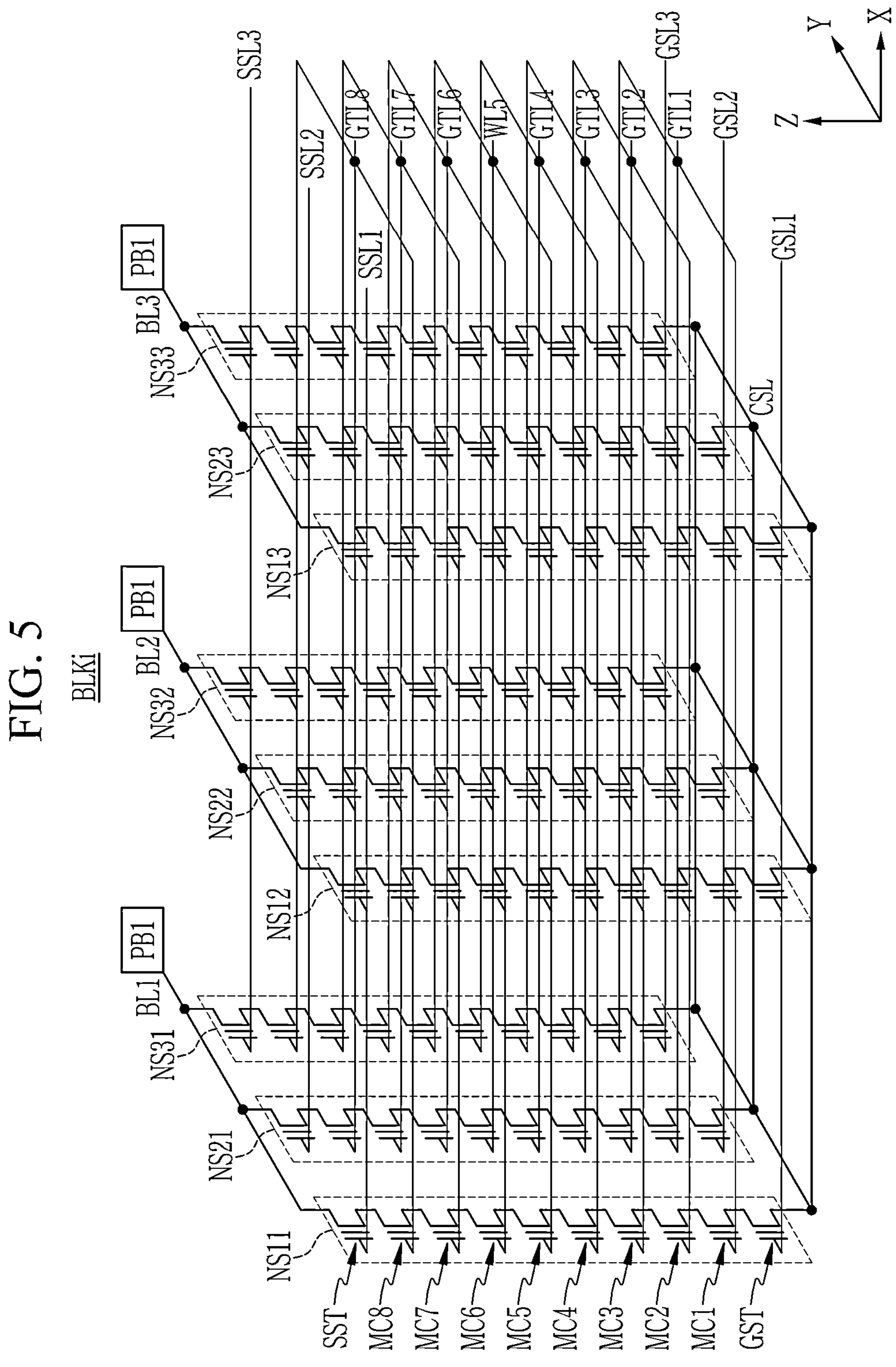
FIG. 5 is a drawing to explain 3-dimensional structure of a memory cell array according to an example embodiment.

FIG. 3 is a drawing to explain a storage device according to an example embodiment. FIG. 4 is a block diagram showing a non-volatile memory device according to an example embodiment. FIG. 5 is a drawing to explain 3-dimensional structure of a memory cell array according to an example embodiment.

A storage device 10*a* may include the non-volatile memory device 100 and the storage controller 200. The non-volatile memory device 100 may correspond to one of the pluralities of non-volatile memory devices NVM11 to NVMmn of FIG. 1 that communicates with the storage controller 200 based on or through a corresponding one of the plurality of channels CH1 to CHm. The storage controller 200 may correspond to the storage controller 200 of FIG. 1.

The non-volatile memory device 100 may include first to seventh pins P11 to P17, a memory interface circuit 110, a control logic circuit 120, and a memory cell array 130. The memory interface circuit 110 may receive a command address signal CA, a data signal DQ, a command address clock signal CA_CLK, a read enable signal nRE and a data strobe signal DQS and a chip enable signal CA_CE through the first to seventh pins P11 to P17 that are separated and different from each other. The memory interface circuit 110 may not only receive the data signal DQ, but also may transmit the data signal DQ to the storage controller 200, through plurality of third pins P13.

The command address clock signal CA_CLK may maintain a static state (e.g., a high level or a low level) and may toggle between the high level and the low level in a specific section. For example, the command address clock signal CA_CLK may be toggled in the section where the command address signal CA is transmitted.

The memory interface circuit 110 may obtain a command/address CMD/ADDR from the command address signal CA based on toggle timings of the command address clock signal CA_CLK. According to an example embodiment, first to second pins P11 to P12 through which the command address signal CA is received may be command address pins. According to an example embodiment, the command CMD may include a data read command, a data write command, a noise monitoring command, an operating state update command, etc.

According to an example embodiment, the memory interface circuit 110 may output the noise state data NSD and/or the ready/busy state data RBSD generated based on the command address clock signal CA_CLK. According to an example embodiment, the memory interface circuit 110 may output the command address signal CA to a controller interface circuit 210 based on the toggle timings of the command address clock signal CA_CLK. A command address signal CA including the noise state data NSD and/or the ready/busy state data RBSD based on toggle timings of a command address clock signal CA_CLK may be output and then input to the controller interface circuit 210.

According to an example embodiment, an output of the noise state data NSD may be performed through a universal internal bus (UIB) read, a status read, etc.

In a data DATA output operation of the non-volatile memory device 100, the memory interface circuit 110 may receive a read enable signal nRE that toggles through a fifth pin P15 before outputting the data DATA. The memory interface circuit 110 may generate the data strobe signal DQS that toggles based on toggling of the read enable signal nRE. For example, the memory interface circuit 110 may generate the data strobe signal DQS that starts toggling after a desired (or alternatively, predetermined) delay based on the toggling start time of the read enable signal nRE. The memory interface circuit 110 may output the data signal DQ including data DATA based on the toggle timing of the data strobe signal DQS. Accordingly, the data DATA may be aligned with the toggle timing of the data strobe signal DQS to be transmitted to the storage controller 200.

In the data DATA input operation of the non-volatile memory device 100, the controller interface circuit 210 may generate the toggling data strobe signal DQS. For example, the data strobe signal DQS may maintain a fixed state (e.g., high level or low level) and start toggling before the data DATA is transmitted. The controller interface circuit 210 may transmit the data signal DQ including data DATA to the non-volatile memory device 100 based on the toggle timings of the data strobe signal DQS. For example, the data DATA may be transmitted aligned with edge timing of the data strobe signal DQS.

According to an example embodiment, a plurality of third pin P13 through which the data signal DQ is input/output may be a data pin.

The storage controller 200 may include first to seventh pins P21 to P27, and a controller interface circuit 210. The first to seventh pins P21 to P27 may correspond to first to seventh pins P11 to P17 of the non-volatile memory device 100, respectively. Accordingly, the controller interface circuit 210 may transmit a command address signal CA, a data signal DQ, a command address clock signal CA_CLK, a read enable signal nRE, a data strobe signal DQS, and a chip enable signal CA_CE. The controller interface circuit 210 may not only transmit the data signal DQ, but also receive the data signal DQ from the non-volatile memory device 100, through a plurality of third pins P23. Likewise, according to an example embodiment, first to second pins P21 to P22, through which the command address signal CA is input/output, may be command address pins, and a plurality of third pins P23, through which the data signal DQ is input/output, may be data pin.

Referring to FIG. 4 together, the non-volatile memory device 100 may include a control logic 120, a memory cell array 130, a page buffer 140, a voltage generator 150 and a row decoder 160. Although not shown in FIG. 4, according to an example embodiment, the non-volatile memory device 100 may further include a memory interface circuit 110, and may further include a column logic, a pre-decoder, a temperature sensor, a command decoder, an address decoder, etc.

The control logic 120 may control various operations in the non-volatile memory device 100 as a whole. The control logic 120 may output various control signals in response to a command CMD and/or an address ADDR from the first to second pins P11 to P12 of the memory interface circuit 110. For example, the control logic 120 may output a voltage control signal CTRL_vol, a row address X-ADDR, and a column address Y-ADDR. The control logic 120 may output a page buffer control signal PCNT to control the page buffer 140.

The control logic 120 may include a current noise detection unit 121, a current noise register unit 122, a voltage noise detection unit 123 and a voltage noise register unit 124. According to an example embodiment, the current noise detection unit 121 and the voltage noise detection unit 123 may generate an index value related to noise. The current noise register unit 122 and the voltage noise register unit 124 may temporarily store the index value, and the control logic 120 may generate the noise state data NSD based on the temporarily stored index value in response to reception of a noise monitoring command.

According to an example embodiment, the noise state data NSD may be generated based on a core voltage Vcc applied to the page buffer 140 and/or a core current Icc input to the page buffer 140. The noise state data NSD may include information of noise detection status for part of the non-volatile memory device 100 and/or memory cell array 130. For example, the noise state data NSD may include noise state information for one plane of the memory cell array 130.

Specific descriptions for the noise state data NSD, the current noise detection unit 121, the current noise register unit 122, the voltage noise detection unit 123, and the voltage noise register unit 124 will be provided later in the explanation of FIGS. 7 to 12.

The control logic 120 may generate the ready/busy state data RBSD. The generated ready/busy state data RBSD may represent information about an operating state of part of the non-volatile memory device 100 and/or memory cell array 130. For example, the ready/busy state data RBSD may include operation state information for one plane of the memory cell array 130. The operating state may include a ready state, a busy state, and an input/output state.

The control logic 120 may output the generated noise state data NSD and/or ready/busy state data RBSD to the first to second pins P11 to P12 of the memory interface circuit 110. The noise state data NSD and/or the ready/busy state data RBSD output through first to second pins P11 to P12 may be provided to the storage controller 200 in the form of the command address signal CA.

The memory cell array 130 may include a plurality of memory blocks BLK1 to BLKz (z is a positive integer), and each of the plurality of memory blocks BLK1 to BLKz may include a plurality of memory cells and may include a plurality of planes 130_1 to 1304 (FIG. 6) including part of the plurality of memory blocks BLK1 to BLKz. The memory cell array 130 may be connected to the page buffer 140 through bit lines BL and may be connected to the row decoder 160 through word lines WL, string selection lines SSL, and ground selection lines GSL.

In an example embodiment, the memory cell array 130 may include a 3-dimensional memory cell array, and the 3-dimensional memory cell array may include a plurality of NAND strings. Each NAND string may include memory cells connected to word lines stacked vertically on the substrate, respectively. In another example embodiment, the memory cell array 130 may include a two-dimensional memory cell array, and the two-dimensional memory cell array may include a plurality of NAND strings arranged along row and column directions.

Referring to FIG. 5, each of the plurality of memory blocks BLK1 to BLKz may be represented as an equivalent circuit as shown. A memory block BLK1 shown in FIG. 5 represents a 3-dimensional memory block formed in a three-dimensional structure on a substrate. For example, a plurality of memory NAND strings included in the memory block BLKi may be formed in a vertical direction with the substrate.

The memory block BLKi may include a plurality of memory NAND strings NS11 to NS33 connected between a plurality of bit lines BL1, BL2 and BL3 and a common source line CSL. Each of the plurality of memory NAND strings NS11 to NS33 may include a string selection transistor SST, a plurality of memory cells MC1 to MC8, and a ground selection transistor GST. In FIG. 5, each of the plurality of memory NAND strings NS11 to NS33 is shown to include eight memory cells MC1 to MC8, but is not limited thereto.

The string selection transistor SST may be connected to a corresponding one of string selection lines SSL1, SSL2 and SSL3. Each of the plurality of memory cells MC1 to MC8 may be connected to a corresponding one of gate lines GTL1 to GTL8. The gate lines GTL1 to GTL8 may correspond to word lines, and some of the gate lines GTL1 to GTL8 may correspond to dummy word lines. The ground selection transistor GST may be connected to a corresponding one of ground selection lines GSL1, GSL2 and GSL3. The string selection transistor SST may be connected to a corresponding one of bit lines BL1, BL2 and BL3, and the ground selection transistor GST may be connected to the common source line CSL. Each of the bit lines BL1, BL2 and BL3 may be connected to a corresponding one of page buffers PB1, PB2 and PB3. Each of the page buffers PB1, PB2 and PB3 may be a page buffer included in the page buffer 140 of FIG. 4.

Word lines of the same height may be commonly connected, and the ground selection lines GSL1, GSL2 and GSL3 and the string selection lines SSL1, SSL2 and SSL3 may be separated, respectively. In FIG. 5, a memory block BLK is shown as connected to eight gate lines GTL1 to GTL8 and three bit lines BL1, BL2 and BL3, but inventive concepts are not limited thereto.

The page buffer 140 may include a plurality of page buffers PB1 to PBn (n is an integer greater than or equal to 3), and the plurality of page buffers PB1 to PBn may be connected to memory cells through a plurality of bit lines BL, respectively. The page buffer 140 may select at least one bit line among the plurality of bit lines BL in response to the column address Y-ADDR.

The page buffer 140 may operate as a write driver or sense amplifier according to an operation mode. For example, during a program operation, the page buffer 140 may apply a bit line voltage corresponding to data DATA to be programmed to a selected bit line based on the applied core voltage Vcc. During a read operation, the page buffer 140 may detect the data DATA stored in a memory cell by detecting the current or voltage of the selected bit line. According to an example embodiment, the data DATA may be input/output through the plurality of third pins P13 of the page buffer 140 and the memory interface circuit 110.

The voltage generator 150 may generate various types of voltages to perform program, read, and erase operations based on the voltage control signal CTRL_vol. For example, the voltage generator 150 may generate a program voltage, a read voltage, a program verification voltage, an erase voltage, etc. as a word line voltage VWL or may generate a bit line voltage as a core voltage Vcc.

The row decoder 160 may select one of a plurality of word lines WL and one of a plurality of string selection lines SSL in response to the row address X-ADDR. For example, during a program operation, the row decoder 160 may apply a program voltage and a program verification voltage to the selected word line, and may apply a read voltage to the selected word line during a read operation.

Figure 6:
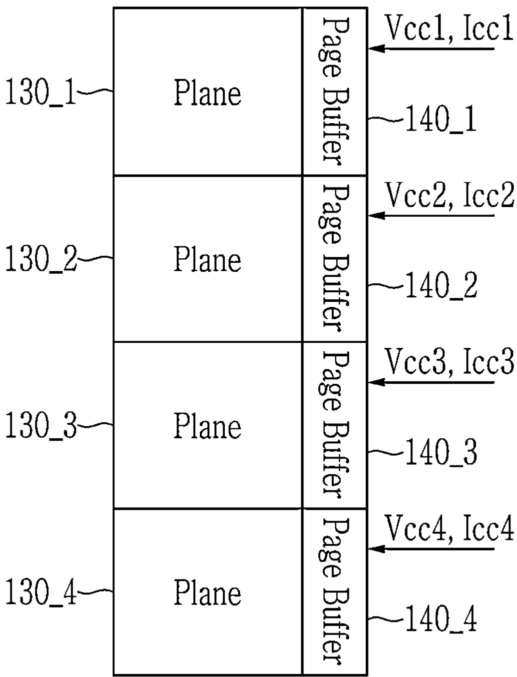
FIG. 6 is a drawing to explain a non-volatile memory device according to an example embodiment.

FIG. 6 is a drawing to explain a non-volatile memory device according to an example embodiment. FIG. 6 is a block diagram showing the connection relationship of a plurality of planes 130_1 to 130_4 and page buffers 140_1 to 140_4 included in the memory cell array 130 of FIG. 4.

Referring to FIG. 4 and FIG. 6, the memory cell array 130 may include a plurality of planes 130_1 to 130_4. The plurality of planes 130_1 to 1304 may include a plurality of memory blocks BLK1 to BLKz as shown in FIG. 4. In FIG. 6, although the plurality of planes 130_1 to 130_4 are shown as consisting of four, the present inventive concepts are not limited thereto.

The page buffer 140 may include a plurality of page buffers 140 to 1-140_4. The plurality of page buffers 140_1 to 140_4 may be arranged to correspond to the plurality of planes 130_1 to 130_4, respectively, and may be connected to the plurality of planes 130_1 to 1304, respectively. The plurality of page buffers 140_1 to 140_4 may be a page buffer 140 including a plurality of page buffers PB1 to PBn of FIG. 4.

The control logic 120 may provide a page buffer control signal PCNT to each of the plurality of page buffers 140_1 to 140_4 to read data stored in each of the plurality of planes 130_1 to 130_4. In addition, to perform data input/output operations for a plurality of planes 130_1 to 1304, each of the plurality of page buffers 140_1 to 1404 may be provided with first to fourth core voltages Vcc1 to Vcc4 and/or first to fourth core currents Icc1 to Icc4.

The control logic 120 may output only data stored in one plane among the plurality of planes, and may perform a data input operation only for one plane among the plurality of planes. In addition, the control logic 120 may operate in a plane independent read (PIR) method or a plane independent core (PIC) method, and may control the configuration of the non-volatile memory device 100 to read data stored in two or more planes among the plurality of planes 130_1 to 130_4 in parallel. Accordingly, while one of the plurality of planes occupies a data bus within a channel and performs data input/output operations, one of the remaining plurality of planes may internally perform a read operation in parallel.

Figures 7, 8:
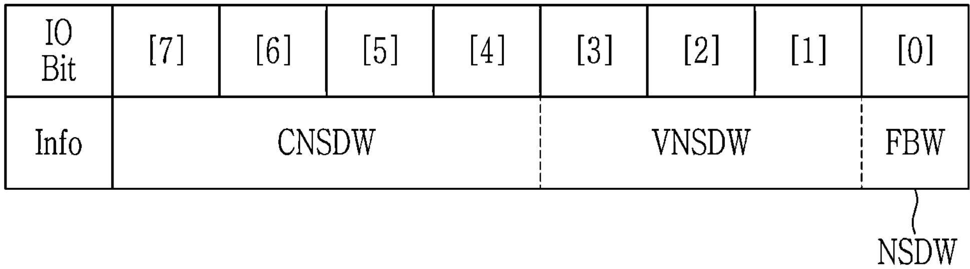
FIG. 7 is a data frame of noise state data according to an example embodiment.
FIG. 8 is a data frame of noise state data according to an example embodiment.
Figure 9:
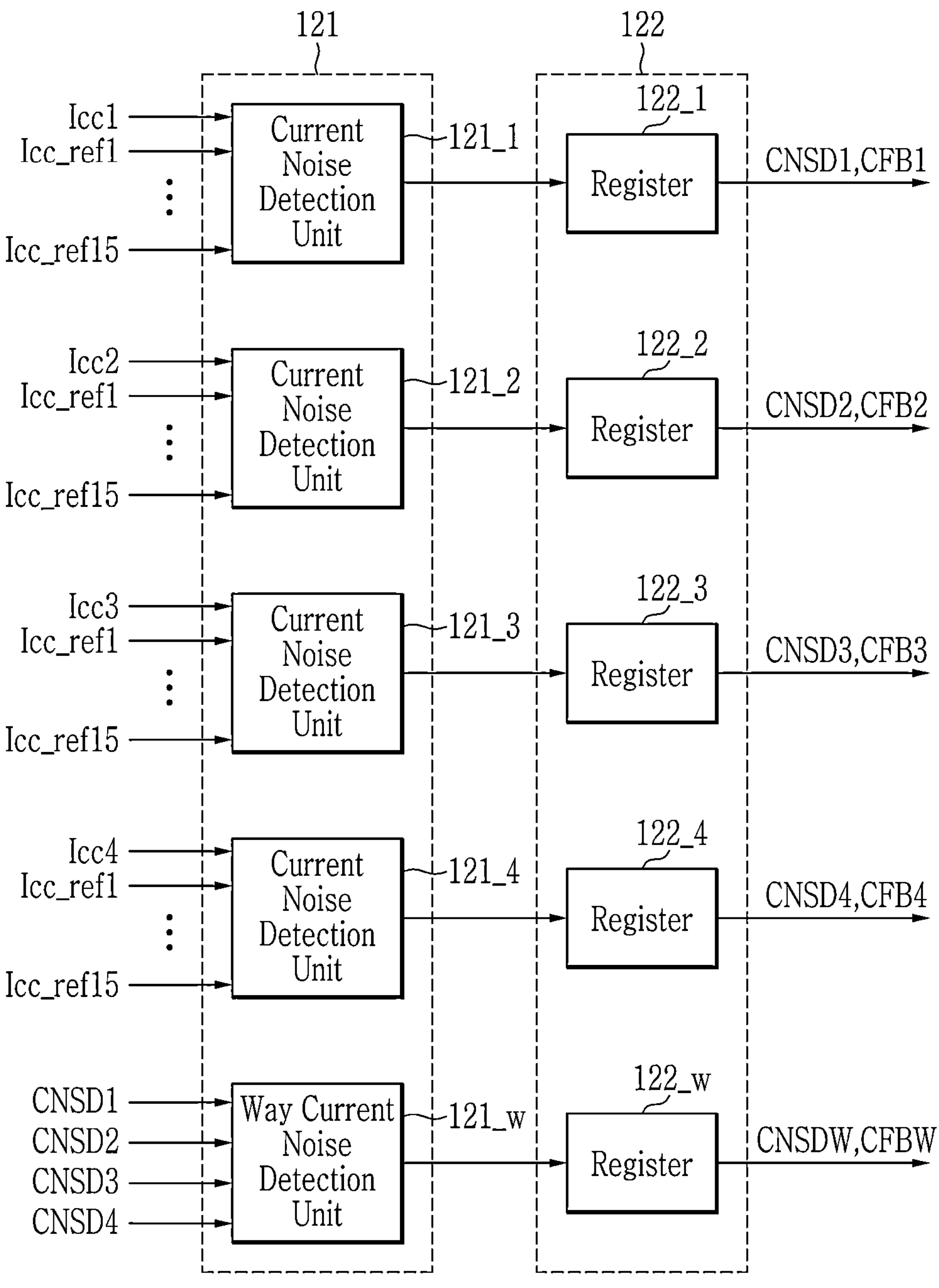
FIG. 9 and FIG. 10 are drawings to explain a current noise detection unit according to an example embodiment.
Figure 10:
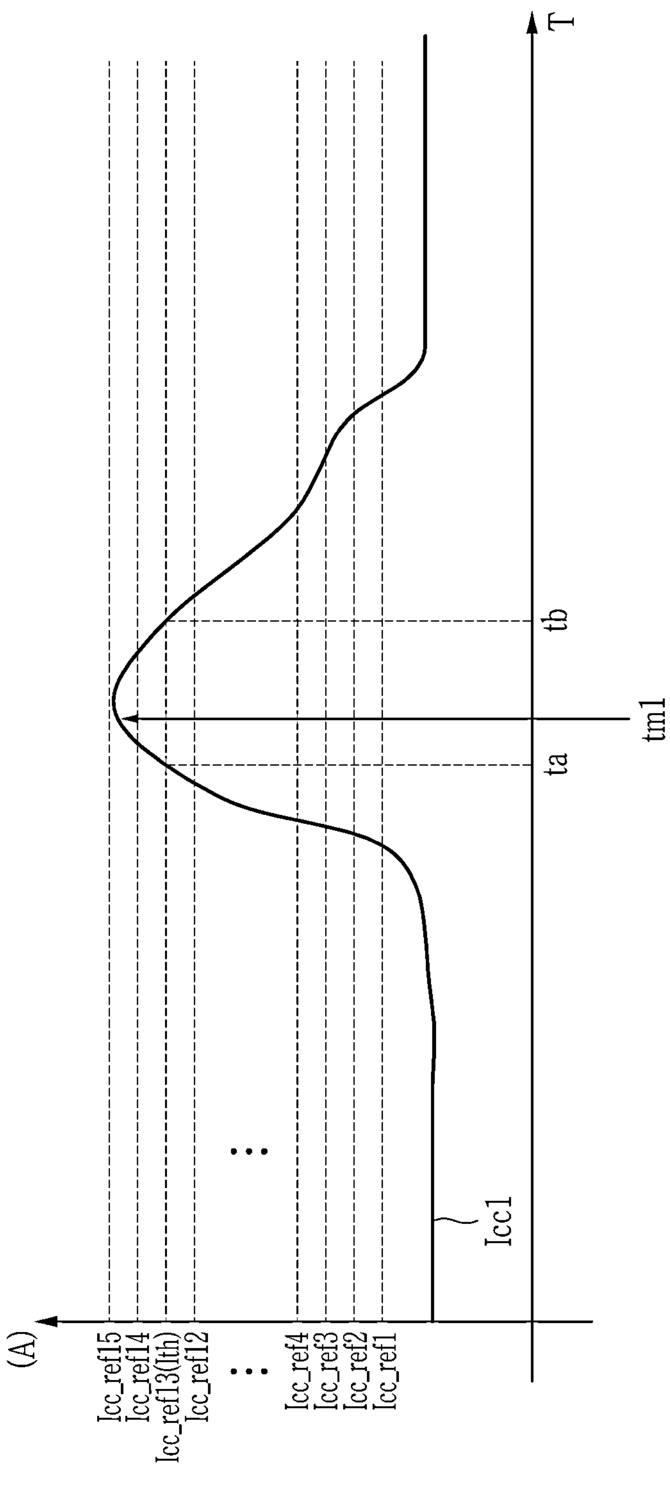
Figure 11:
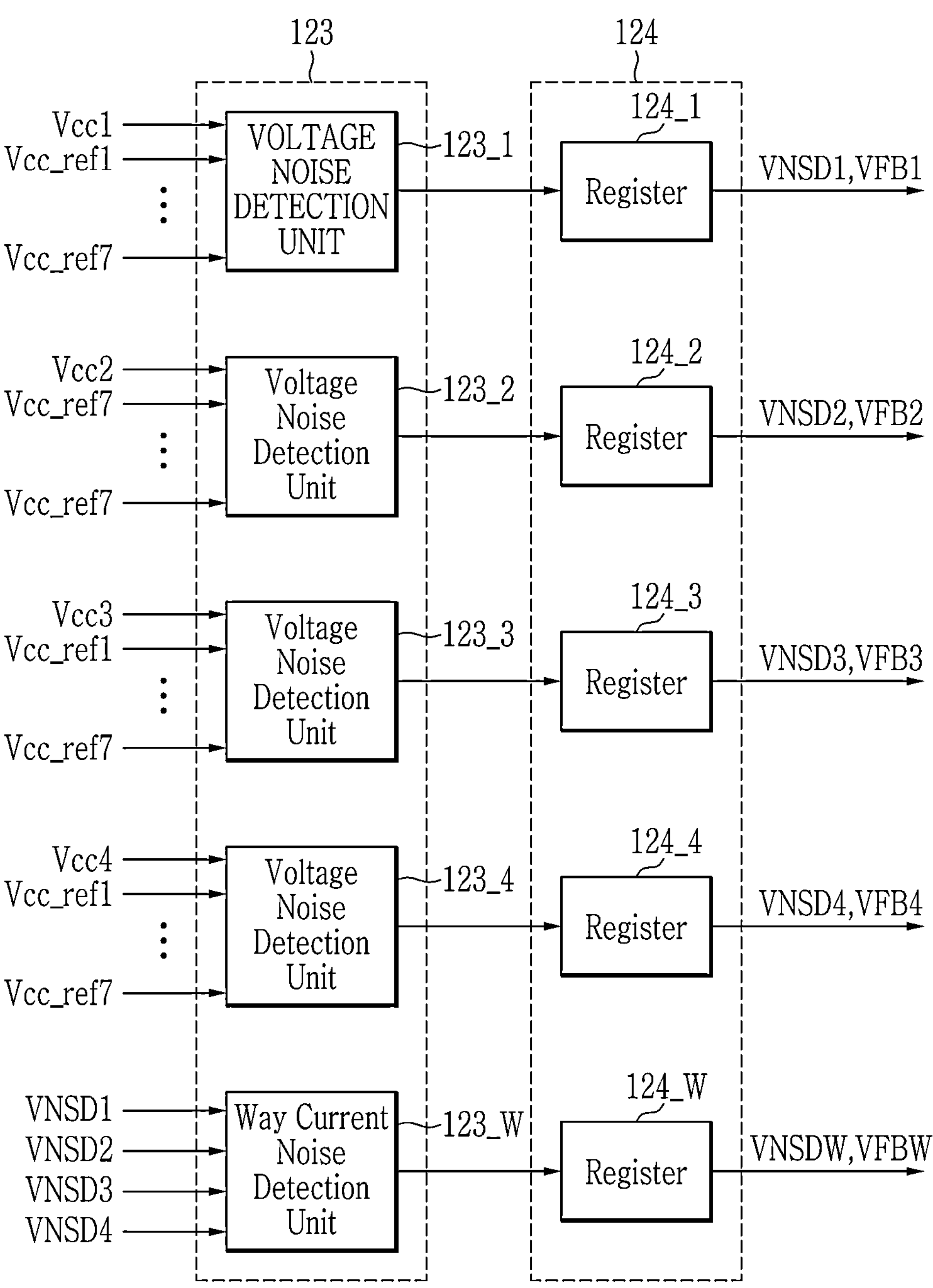
Figure 12:
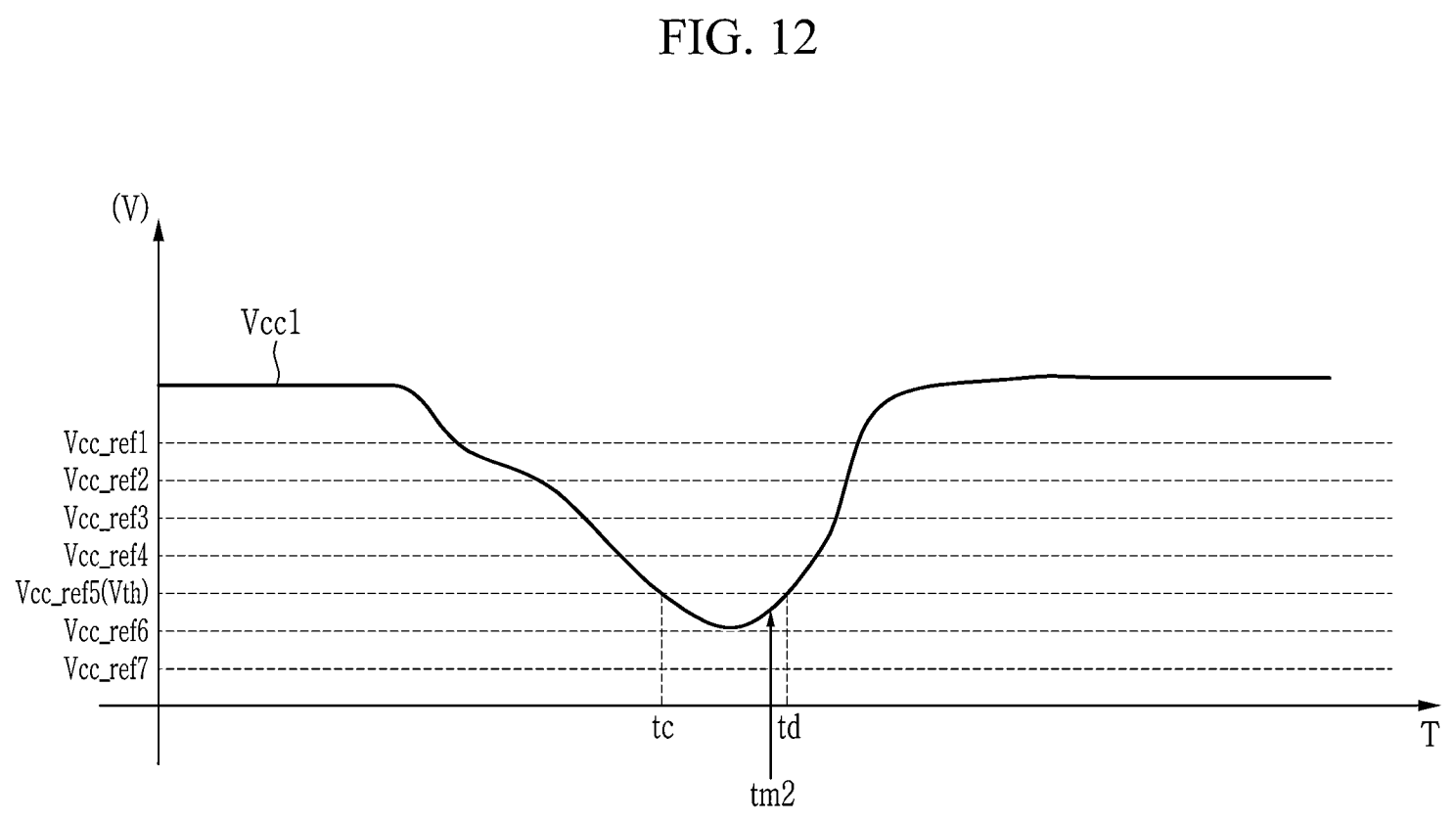

FIG. 7 is a data frame of noise state data according to an example embodiment. FIG. 8 is a data frame of noise state data according to an example embodiment. FIG. 9 and FIG. 10 are drawings to explain a current noise detection unit according to an example embodiment. FIG. 11 and FIG. 12 are drawings to explain a voltage noise detection unit according to an example embodiment.

Referring to FIG. 4, FIG. 6 and FIG. 7 to FIG. 11, the noise state data NSD may include first to fourth noise state data NSD1 to NSD4 and a way noise state data NSDW. In addition, the current noise detection unit 121 may include first to fourth current noise detection units 121_1 to 121_4 and a way current noise detection unit 121_W. The voltage noise detection unit 123 may include first to fourth voltage noise detection units 123_1 to 1234, and a way voltage noise detection unit 123_W.

For ease of explanation, hereinafter, a first noise state data NSD1, a first current noise detection unit 121_1 and a first voltage noise detection unit 123_1, the first to fourth noise state data NSD1 to NSD4 will be mainly described to describe the first to fourth current noise detection units 121_1 to 121_4 and the first to fourth voltage noise detection units 123_1 to 123_4.

The first noise state data NSD1 may correspond to second to fourth noise state data NSD2 to NSD4, the first current noise detection unit 121_1 may correspond to second to fourth current noise detection units 121_2 to 121_4, and the first voltage noise detection unit 123_1 may correspond to second to fourth voltage noise detection units 123_2 to 123_4. It is obvious that descriptions of the first to fourth noise state data NSD1 to NSD4, the first to fourth current noise detection units 121_1 to 121_4 and the first to fourth voltage noise detection units 123_1 to 123_4 may be replaced with descriptions of the first noise state data NSD1, the first current noise detection unit 121_1 and the first voltage noise detection unit 123_1, respectively.

The first noise state data NSD1 may be a noise state data occurring in a first plane 130_1. Referring to FIG. 7, the first noise state data NSD1 may include a first current noise state data CNSD1, a first voltage noise state data VNSD1 and a first flag bit FB1. The first noise state data NSD1 may be, for example, 1 byte, but is not limited thereto.

The first current noise state data CNSD1 may be a noise index value caused by the peak current generated from a first core current Icc1 input to a first page buffer 140_1. According to an example embodiment, the first current noise state data CNSD1 may be an index value with the number of 4 bits, but is not limited thereto.

The first current noise detection unit 121_1 may compare the first core current Icc1 with the first to fifteenth reference current values Icc_ref1 to Icc_ref15, and may generate a first current noise state data CNSD1 and a first current noise detection bit CFB1 to temporarily store in a first current noise register unit 122_1.

The first current noise detection bit CFB1 may be a flag bit that determines whether a noise sufficient to cause an error in data input/output operation in a first core current Icc1 is detected by comparing the first core current Icc1 with a desired (or alternatively, predetermined) detection current value.

Referring to FIG. 10, the first current noise detection unit 1211 may generate the first current noise state data CNSD1 corresponding to a value between a fourteenth reference current value Icc_ref14 and a fifteenth reference current value Icc_ref15 at a measurement time tm1. The first current noise detection unit 121_1 may generate the first current noise detection bit CFB1 corresponding to 'noise detection' at the measurement time tm1 using a thirteenth reference current value Icc_ref13 as a reference detection current value (Ith) during measurement.

The number of first to fifteenth reference current values Icc_ref1-Icc_ref15 is 15, but the number is only an example, and the number of reference current values may vary according to an example embodiment.

The first voltage noise state data VNSD1 may be a noise index value caused by a ripple phenomenon occurring at a first core voltage Vcc1 applied to the first page buffer 140_1. According to an example embodiment, the first voltage noise state data VNSD1 may be an index value with the number of 3 bits, but is not limited thereto.

The first voltage noise detection unit 123_1 may compare the first core voltage Vcc1 with the first to seventh reference voltage values Vcc_ref1 to Vcc_ref7 and may generate a first voltage noise state data VNSD1 and a first voltage noise detection bit VFB1 to temporarily store in a first voltage noise register unit 124_1.

The first voltage noise detection bit VFB1 may be a flag bit that compares the first core voltage Vcc1 with a detection voltage value to determine whether a noise sufficient to cause an error in data input/output operation in the first core voltage Vcc1 is detected.

Referring to FIG. 12, the first voltage noise detection unit 123_1 may generate a first voltage noise state data VNSD1 corresponding to a value between a fifth reference voltage value Vcc_ref5 and a sixth reference current value Vcc_ref6 at a measurement time tm2. The first voltage noise detection unit 123_1 may generate a first voltage noise detection bit VFB1 corresponding to 'noise detection' at the measurement time tm2 using a fifth reference voltage value Vcc_ref5 as a reference detection voltage value Vth during measurement.

The number of first to seventh reference voltage values Vcc_ref1 to Vcc_ref7 is 7, but the number is only an example, and the number of reference voltage values may vary according to example embodiments.

The first flag bit FB1 may be a flag bit that determines noise detection in the first plane 130_1. The first flag bit FB1 may be generated, for example, by an OR operation of the first current noise detection bit CFB1 and the first voltage noise detection bit VFB1, but is not limited thereto. According to an example embodiment, the storage controller 200 of FIG. 1 may determine a noise detection status for the first plane 130_1 through the first flag bit FB1.

A way noise state data NSDW may be a noise state data generated in the non-volatile memory device 100 corresponding to one way. Referring to FIG. 8, the way noise state data NSDW may include way current noise state data CNSDW, a first voltage noise state data VNSD1, and a way flag bit FBW. The way noise state data NSDW may be, for example, 1 byte, but is not limited thereto.

According to an example embodiment, the way current noise state data CNSDW may be generated based on first to fourth current noise state data CNSD1 to CNSD4. As an example, the way current noise state data CNSDW may be an average value of first to fourth current noise state data CNSD1 to CNSD4. According to an example embodiment, the way current noise state data CNSDW may be an index value with the number of 4 bits, but the number of bits is not limited thereto.

The way current noise detection unit 121_W may generate a way current noise state data CNSDW and a way current noise detection bit CFBW based on the first to fourth current noise state data CNSD1 to CNSD4 to temporarily store in a way current noise register unit 122_W.

For example, the way current noise detection bit CFBW may be generated by comparing the way current noise state data CNSDW with a desired (or alternatively, predetermined) value, and may be a flag bit that determines whether a noise sufficient to cause an error in overall data input/output operations is detected. According to an example embodiment, the way voltage noise state data VNSDW may be generated based on first to fourth voltage noise state data VNSD1 to VNSD4. As an example, the way voltage noise state data VNSDW may be an average value of the first to fourth voltage noise state data VNSD1 to VNSD4. According to an example embodiment, the way voltage noise state data VNSDW may be an index value with the number of 3 bits, but the number of bits is not limited thereto.

The way voltage noise detection unit 123_W may generate a way voltage noise state data VNSDW and a way voltage noise detection bit VFBW based on the first to fourth voltage noise state data VNSD1 to VNSD4 to temporarily store in a way voltage noise register unit 124_W.

For example, the way voltage noise detection bit VFBW may be generated by comparing the way voltage noise state data VNSDW with a desired (or alternatively, predetermined) value, and may be a flag bit that determines whether a noise sufficient to cause an error of data input/output operations in overall is detected.

The way flag bit FBW may be a flag bit that determines noise detection in the non-volatile memory device 100 corresponding to one way. The way flag bit FBW may be generated by an OR operation of the way current noise detection bit CFBW and the way voltage noise detection bit VFBW, but is not limited thereto. According to an example embodiment, the storage controller 200 of FIG. 1 may determine a noise detection status for the non-volatile memory device 100 through the way flag bit FBW.

In FIG. 9 to FIG. 12, a noise state data NSD for a way and/or a plane may be generated based on the core voltages Vcc1 to Vcc4 applied to the page buffer 140 and the core currents Icc1 to Icc4 input, but example embodiments are not limited thereto. The control logic 120 may generate a noise state data NSD based on any one of the voltages and currents (e.g., program voltage, program verification voltage, erase voltage, etc.) of the non-volatile memory device 100 used for data input/output operations.

Figure 13:
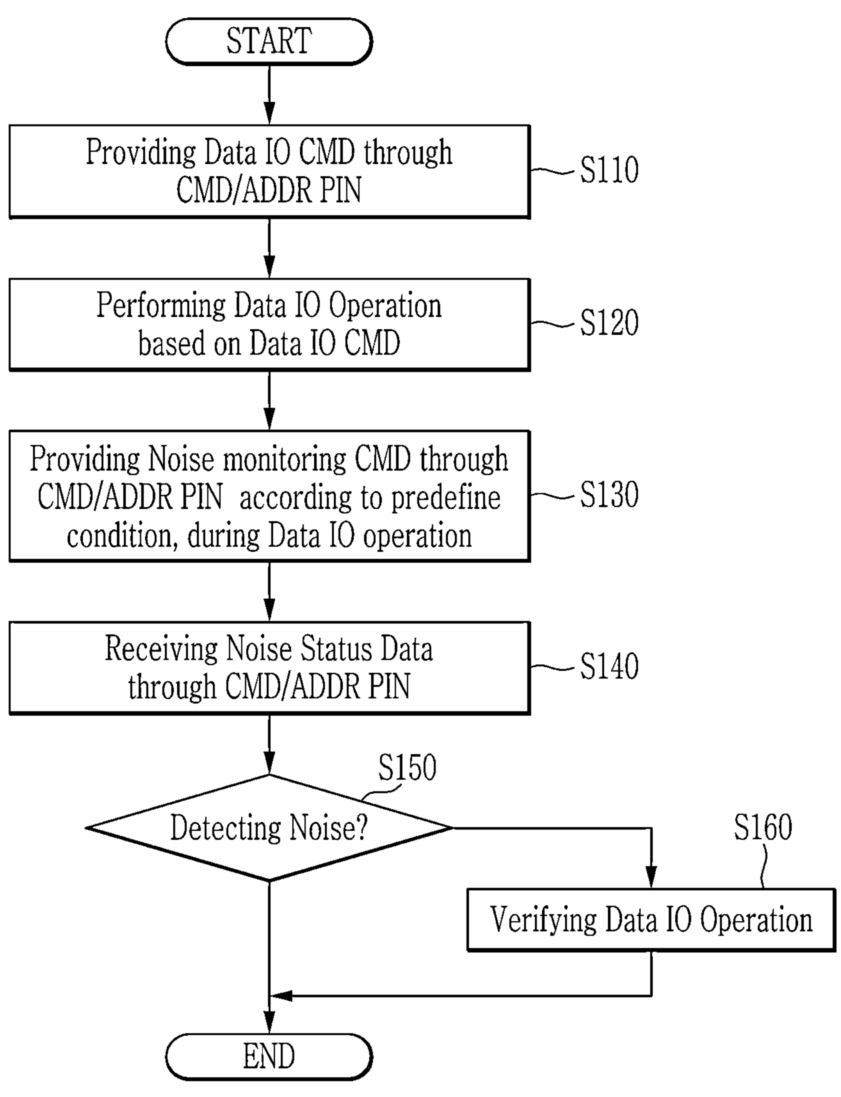
FIG. 13 is a flowchart to explain an operation of a storage device according to an example embodiment.
Figure 14:
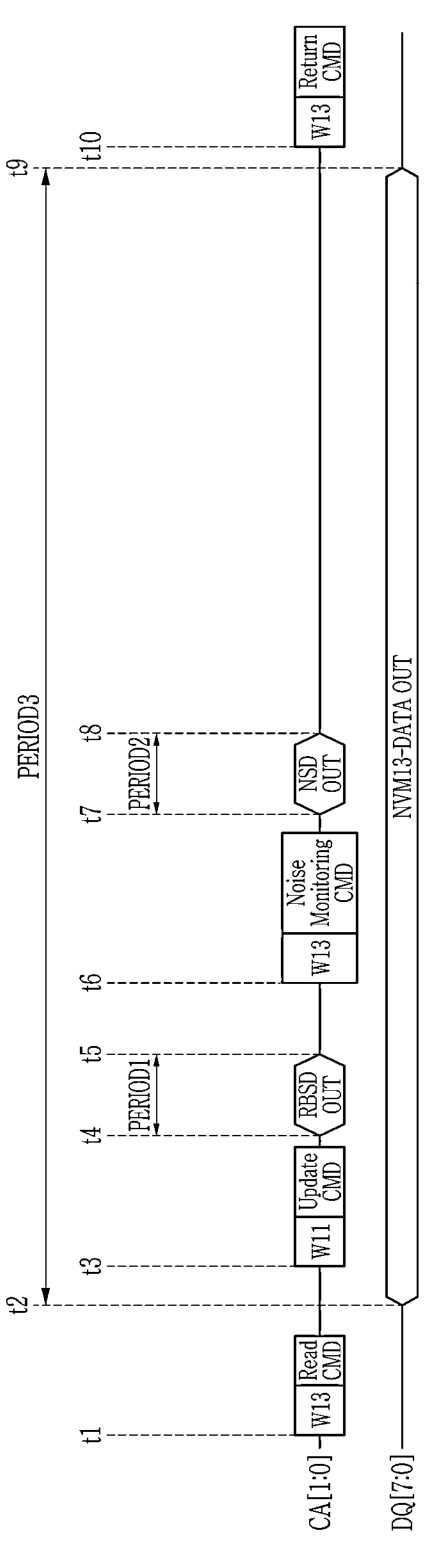
FIG. 14 and FIG. 15 are drawings to explain an operation of a storage device according to an example embodiment.
Figure 15:
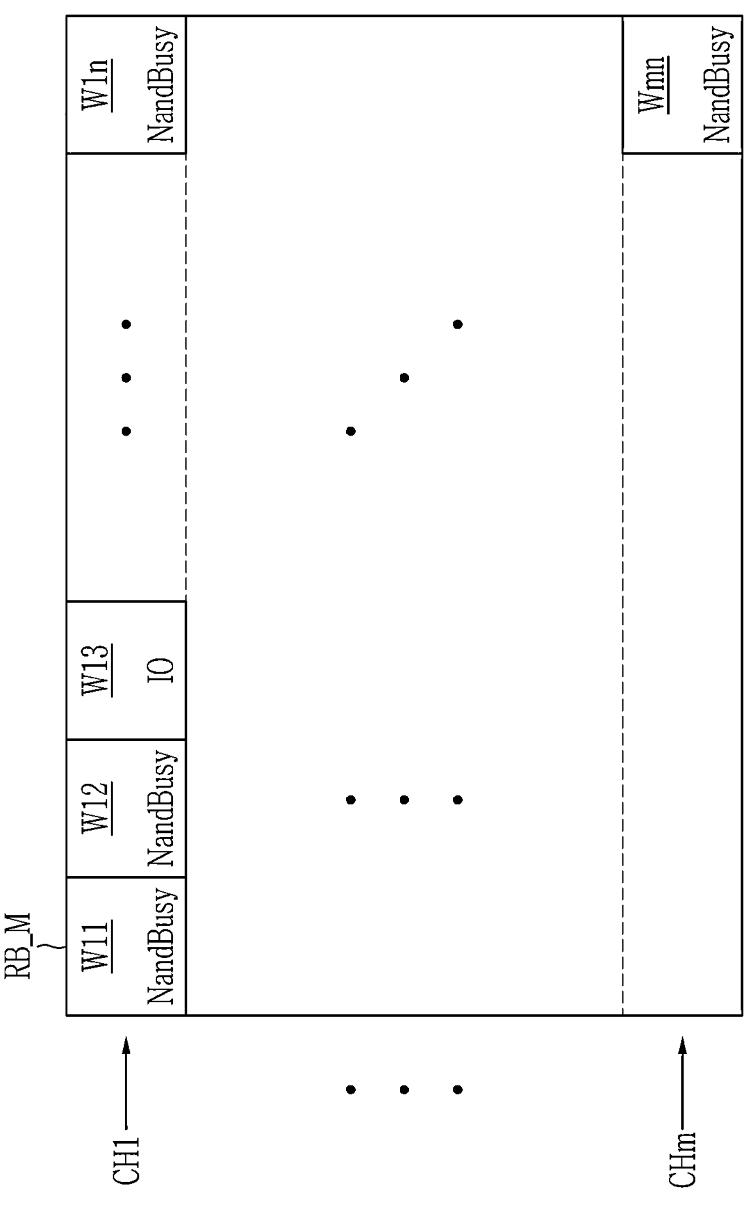

FIG. 13 is a flowchart to explain an operation of a storage device according to an example embodiment. FIG. 14 and FIG. 15 are drawings to explain an operation of a storage device according to an example embodiment.

Referring to FIG. 1 to FIG. 6, FIG. 13 and FIG. 14, the storage controller 200 may provide a data input/output command through a command address pin (S110). The storage controller 200 may provide a read command to the 1_3 non-volatile memory device NVM13 corresponding to a 1_3 way W13 as a command address signal CA through the first to second pins P21 to P22 corresponding to the command address pin at time t1.

The storage controller 200 may perform a data input/output operation based on the data input/output command (S120).

The storage controller 200 may provide a data signal DQ to the 1_3 non-volatile memory device NVM13 based on the read command through a plurality of third pins P23 from time t2 to time t9 after time t1. During a third period PERIOD3 between time t2 and time t9, the 1_3 non-volatile memory device NVM13 may receive a data signal DQ from the storage controller 200 through plurality of third pin P13.

In addition, during the third period PERIOD3 between time t2 and time t9, which is the performance period of the data input/output operation, the data bus of first channel CH1 connected to the 1_3 non-volatile memory device NVM13 may be occupied, and thus the data input/output operations in the first channel CH1 may not be performed during the third period PERIOD3.

According to an example embodiment, a temporal range of the third period PERIOD3 may be 1 us to 900 us, for example, about 10 us to about 900 us.

The storage controller 200 may provide a noise monitoring command through the command address pin according to a desired (or alternatively, predetermined) condition during data input/output operation (S130).

One of the desired (or alternatively, predetermined) conditions may include a case where the non-volatile memory device corresponding to one way among the plurality of ways connected to one channel is in an input/output state, and the plurality of non-volatile memory devices corresponding to the remaining ways are in a busy state.

In addition, another desired (or alternatively, predetermined) condition may include a case where one plane among the plurality of planes connected to one channel is in an input/output state, and the remaining plurality of planes are in a busy state.

The desired (or alternatively, predetermined) condition may be a condition vulnerable to noise in which various configurations are interleaving each other within one channel.

Before the time t3 during the third period PERIOD3, the storage controller 200 may include the ready/busy map RB_M of FIG. 2. Because the 1_1 way W11 of the first channel CH1 is in a ready state, it may not satisfy the desired (or alternatively, predetermined) condition, so the storage controller 200 may not provide a noise monitoring command before the time t3 during the third period PERIOD3.

At the time t3, the storage controller 200 may provide an operating state update command to the 1_1 non-volatile memory device NVM11 corresponding to the 1_1 way W11 through the first to second pins P21 to P22.

After the time t3, during the first period PERIOD1 between time t4 and time t5, a 1_1 non-volatile memory device NVM11 may provide a ready/busy state data RBSD to the storage controller 200 through first to second pins P11 to P12 based on the operating state update command.

According to an example embodiment, a first period PERIOD1 may be a performance period of the operating state update operation, and a time range of the first period PERIOD1 may be 1 ns to 900 ns, for example, about 10 ns to about 900 ns. According to an example embodiment, through a difference between performance period of the first period PERIOD1 and the performance period of the third period PERIOD3, the storage controller 200 may quickly determine an operating state of the connected non-volatile memory device and whether the desired (or alternatively, predetermined) condition is satisfied, and may efficiently perform noise detection in an interleaving condition vulnerable to noise.

Referring to FIG. 15 additionally, through the operating state update operation for the 1_1 way W11 in the first period PERIOD1, the storage device 10*a* may satisfy the desired (or alternatively, predetermined) condition because a 1_3 non-volatile memory device NVM13 of a 1_3 way W13 within the first channel CH1 is in an input/output state, and non-volatile memory devices NVM11 to NVM12 and NVM14 to NVM1*n* corresponding to the remaining 1_1 to 1_2 ways W11 to W12 and 1_4 to 1_n ways W14 to W1*n* are in a busy state. The storage controller 200 may confirm that the desired (or alternatively, predetermined) condition is satisfied based on the updated ready/busy map RB_M.

The storage controller 200 may provide a noise monitoring command to the 1_3 non-volatile memory device NVM13 of the 1_3 way W13 through the first to second pins P21 to P22 at time t6 within the third period PERIOD3. According to an example embodiment, an operating state of the 1_3 non-volatile memory device NVM13 of the 13 way W13 may be an input/output state.

The storage controller 200 may receive a noise state data NSD through a command address pin during a data input/output operation (S140).

During the second period PERIOD2 between time t7 and time t8 within the third period PERIOD3, the 1_3 non-volatile memory device NVM13 may be provided a noise state data NSD to the storage controller 200 through the first to second pins P11 to P12.

The storage controller 200 may receive noise state data NSD through the first to second pins P21 to P22 within the third period PERIOD3.

According to an example embodiment, a second period PERIOD2 may be a performance period of the reception operation of the noise state data NSD, and a time range of the second period PERIOD2 may be about 1 ns to about 900 ns, for example, 10 ns to 900 ns.

According to an example embodiment, through a difference between the performance period of the second period PERIOD2 and the performance period of the third period PERIOD3, the storage controller 200 may improve an operation performance by performing a noise monitoring operation during a data input/output operation.

After the time t8, the storage controller 200 may confirm a noise detection through the noise state data NSD (S150).

When the way flag bit FBW of the noise state data NSD means 'noise not detected', the storage controller 200 may end the data output operation by providing a return signal command to the 1_3 non-volatile memory device NVM13 at time t10 after the third period PERIOD3 ends.

When the noise detection is confirmed through the noise state data NSD, the data input/output operations may be verified (S160).

When the way flag bit FBW of the noise state data NSD means 'noise detection', a verification operation may be performed. According to an example embodiment, after time t9, the storage controller 200 may verify an ECC generated through a read operation of the third period PERIOD3.

When a data input operation is performed during the third period PERIOD3 and the way flag bit FBW of the noise state data NSD means 'noise detection', according to an example embodiment, the storage controller 200 may perform recovery operations on data input after time t9.

Figure 16:
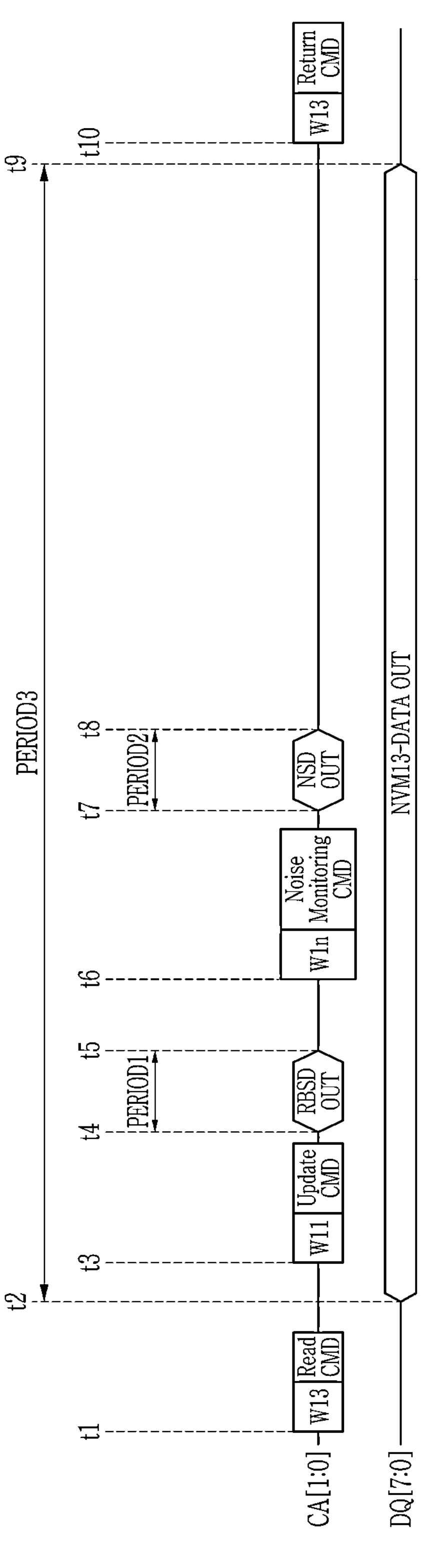
FIG. 16 is a drawing to explain an operation of a storage device according to an example embodiment.

FIG. 16 is a drawing to explain an operation of a storage device according to an example embodiment. FIG. 16 may correspond to FIG. 14, and the explanation of FIG. 16 will focus on differences from FIG. 14 for ease of explanation.

Referring to FIG. 1 to FIG. 6, FIG. 13 and FIG. 16, the storage controller 200 may provide a noise monitoring command to a 1_n non-volatile memory device NVM1*n* of a 1_n way W1*n* through the first to second pins P21 to P22 at time t6 within the third period PERIOD3. According to an example embodiment, the operating state of the 1_n non-volatile memory device NVM1*n* of the 1_n way W1*n* may be a busy state.

During the second period PERIOD2 between time t7 and time t8 within the third period PERIOD3, the 1_n non-volatile memory device NVM1*n* may be provide a noise state data NSD to the storage controller 200 through the first to second pins P11 to P12.

Likewise, the storage controller 200 may receive a noise state data NSD through the first to second pins P21 to P22 within the third period PERIOD3.

FIG. 17 is a drawing to explain a storage device according to an example embodiment. FIG. 17 represents a ready/busy map RB_M' including a ready/busy state data for a plane. FIG. 17 may correspond to FIG. 2, and the explanation of FIG. 17 will focus on differences from FIG. 2 for ease of explanation.

Referring to FIG. 1, FIG. 4, FIG. 6 and FIG. 17, the ready/busy map RB_M' according to an example embodiment may include a ready/busy state data for a plane within each of the non-volatile memory devices NVM11 to NVMmn in a bitmap format. The storage controller 200 according to an example embodiment may check the operating state of a plurality of planes connected to the storage controller 200 through the ready/busy map RB_M'.

Referring to FIG. 17, the storage controller 200 may confirm that a 1_11 plane P111, a 1_12 plane P112, a 1_13 plane P113, a 1_21 plane P121, a 1_22 plane P122, a 1_23 plane P123, and a 1_n1 to 1_n4 planes P1*n*1 to P1*n*4 are in a busy state, a 1_14 plane P114 is in a ready state, and a 1_24 plane P124 is in an input/output state, through the ready/busy map RB_M', within a first channel CH1. In addition, the storage controller 200 may confirm that m_n1-th plane Pmn1 is in a busy state, m_n2-th plane Pmn2 is in an input/output state, and m_n3-th to m_n4-th planes Pmn3 to Pmn4 are in a ready state, through a ready/busy map RB_M', within an n-th channel CHn.

The 1_11 to 1_14 planes P111 to P114 may correspond to the 1_1 way W11 of FIG. 1, and 1_21 to 1_24 planes P121 to P124 may correspond to the 1_2 way W12 of FIG. 1, and the 1_n1 to 1_n4 planes P1*n*1 to P1*n*4 may correspond to the 1_n way W1*n* of FIG. 1, and the m_n1 to m_n4 planes Pmn1 to Pmn4 may correspond to an m_nth way Wmn of FIG. 1

Figure 18:
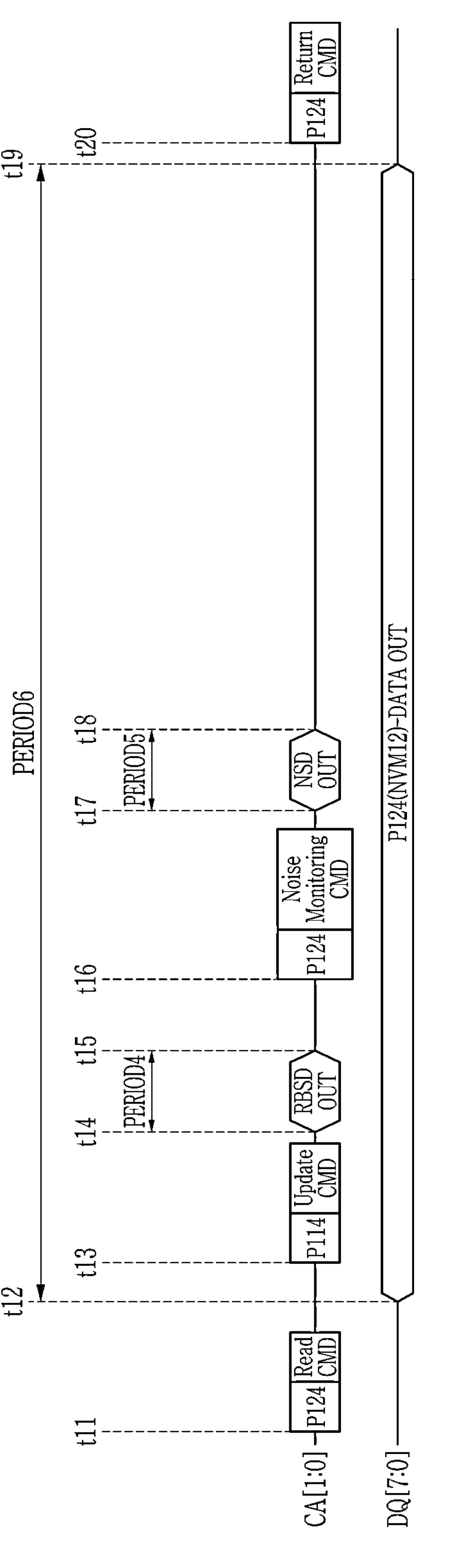

FIG. 17 and FIG. 18 are drawings to explain an operation of a storage device according to an example embodiment. FIG. 17 and FIG. 18 may correspond to FIG. 15 and FIG. 14, respectively, and for ease of explanation, the explanation of FIG. 17 and FIG. 18 will focus on differences from FIG. 14 and FIG. 15.

Referring to FIG. 1, FIG. 3 to FIG. 6, FIG. 13, FIG. 17 and FIG. 18, the storage controller 200 may provide a data input/output command through a command address pin.

The storage controller 200 may provide a read command to the 1_24 plane P124 as a command address signal CA through the first to second pins P21 to P22 corresponding to the command address pins at time t11.

The storage controller 200 may perform a data input/output operations based on data input/output commands (S120). The storage controller 200 may provide a data signal DQ to the 1_24 plane P124 based on a read command through the plurality of third pins P23 from time t12 to time t19 after time t11. During a sixth period PERIOD6 between time t12 and time t19, the 1_24 plane P124 may receive a data signal DQ from the storage controller 200 through the plurality of third pin P13.

The explanation of the third period PERIOD3 in FIG. 14 may be applied to the sixth period PERIOD6.

The storage controller 200 may provide a noise monitoring command through the command address pin according to the desired (or alternatively, predetermined) conditions during data input/output operation.

In addition, another desired (or alternatively, predetermined) condition may include a case where one plane among the plurality of planes connected to one channel is in an input/output state, and the remaining plurality of planes are in a busy state.

Before time t13 during the sixth period PERIOD6, the storage controller 200 may include a ready/busy map RB_M' of FIG. 17. Because the 1_14 plane P114 of first channel CH1 is in a ready state, it may not satisfy the desired (or alternatively, predetermined) condition, so the storage controller 200 may not provide a noise monitoring command before time t13 during the sixth period PERIOD6.

At time t13, the storage controller 200 may provide an operating state update command to the 1_14 plane P114 through the first to second pins P21 to P22.

After time t13, during a fourth period PERIOD4 between time t14 and time t15, the 1_14 plane P114 may provide a ready/busy state data RBSD to the storage controller 200 through the first to second pins P11 to P12 based on the operating state update command. The explanation of the first period PERIOD1 in FIG. 14 may be applied to the fourth period PERIOD4.

Referring to FIG. 19 additionally, through an operating state update operation for 1_14 plane P114 in the fourth period PERIOD4, the storage device 10*a* may satisfy the desired (or alternatively, predetermined) condition because a 1_24 plane P124 in the first channel CH1 is in an input/output state and the remaining 1_11 to 1_23 planes P111 to P123 and 1_31 to 1_n4 planes P131 to P1*n*4 are in a busy state. The storage controller 200 may confirm that the desired (or alternatively, predetermined) condition is satisfied based on the updated ready/busy map RB_M'.

The storage controller 200 may provide a noise monitoring command to the 1_24 plane P124 through the first to second pins P21 to P22 at time t16 within the sixth period PERIOD6. According to an example embodiment, an operating state of 1_24 plane P124 may be an input/output state.

The storage controller 200 may receive a noise state data NSD through a command address pin during a data input/output operation (S140).

During a fifth period PERIOD5 between time t17 to time t18 within the sixth period PERIOD6, the 1_24 plane P124 may provide a noise state data NSD to the storage controller 200 through the first to second pins P11 to P12. An explanation of the second period PERIOD2 in FIG. 14 may be applied to the fifth period PERIOD5.

The storage controller 200 may receive a noise state data NSD through the first to second pins P21 to P22 within the sixth period PERIOD6.

After the time T18, the storage controller 200 may confirm noise detection through noise state data NSD (S150).

When a flag bit of the noise state data NSD of the 1_24 plane P124 means ‘noise not detected’, the storage controller 200 may end a data output operation by providing a return signal command to the 1_24 plane P124 at time t20 after the sixth period PERIOD6 ends.

When the noise detection is confirmed through the noise state data NSD, the data input/output operations may be verified (S160).

When the flag bit for 1_24 plane P124 of the noise state data NSD means 'noise detection', a verification operation may be performed. According to an example embodiment, the storage controller 200 may verify through a read operation in the sixth period PERIOD6 after time t19.

When a data input operation is performed during the sixth period PERIOD6 and the flag bit of noise state data NSD means 'noise detection', according to an example embodiment, the storage controller 200 may perform recovery operations for data input after time t19.

Figure 20:
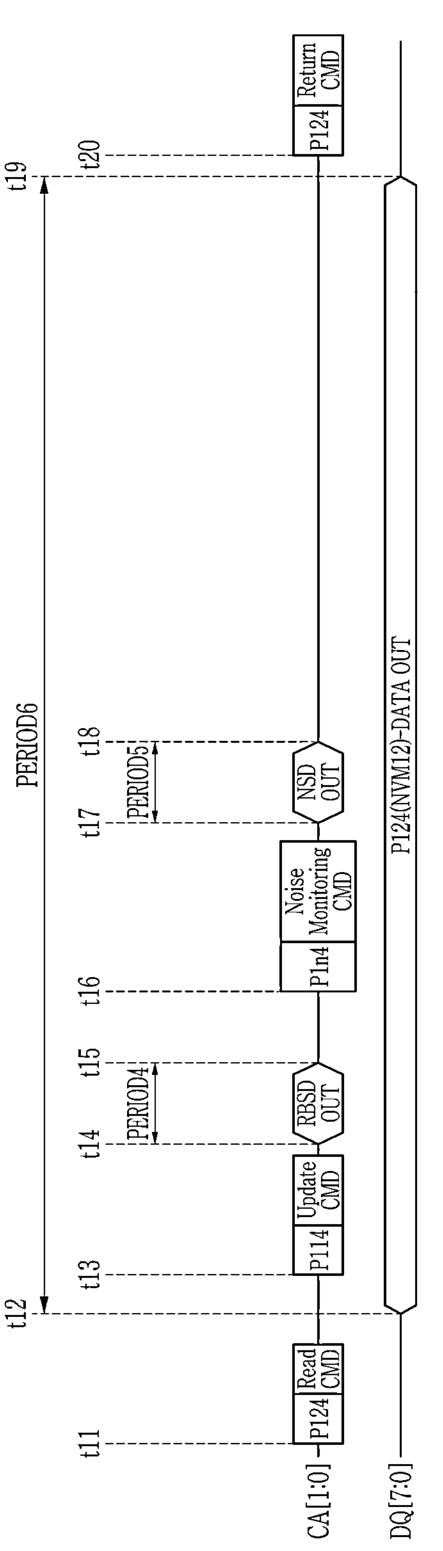
FIG. 20 is a drawing to explain an operation of a storage device according to an example embodiment.

FIG. 20 is a drawing to explain an operation of a storage device according to an example embodiment. FIG. 20 may correspond to FIG. 8, for ease of explanation, and the explanation of FIG. 20 will focus on differences from FIG. 18.

Referring to FIG. 1 to FIG. 6, FIG. 13 and FIG. 20, the storage controller 200 may provide a noise monitoring command to a 1_n4 plane P**1*n*4 through the first to second pins P21 to P22 at time t16 within the sixth period PERIOD6. According to an example embodiment, an operating state of the 1_n4 plane P1*n*4** may be a busy state.

During the fifth period PERIOD5 between time t17 to time t18 within the sixth period PERIOD6, the 1_n4 plane P**1*n*4 may provide a noise state data NSD to the storage controller 200 through the first to second pins P11 to P12**.

Likewise, the storage controller 200 may receive noise state data NSD through the first to second pins P21 to P22 within the sixth period PERIOD3.

Figure 21:
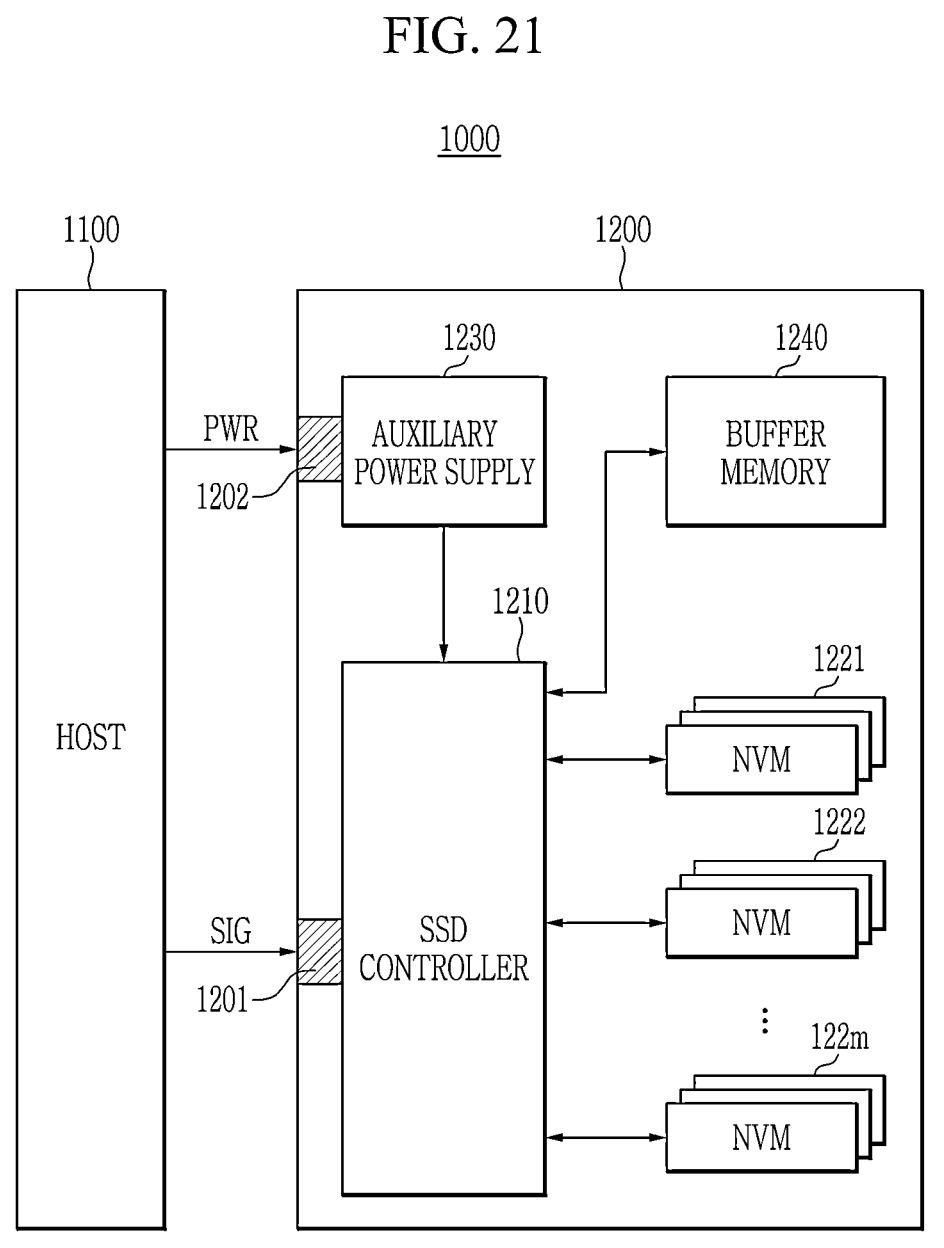

FIG. 21 is a block diagram showing an SSD system to which a storage device is applied according to an example embodiment. Referring to FIG. 21, an SSD system 1000 may include a host 1100 and an SSD 1200.

The SSD 1200 may exchange a signal SIG with the host 1100 through a signal connector 1201 and receive power PWR input through a power connector 1202. The SSD 1200 may include an SSD controller 1210, a plurality of flash memory 1221 to **122*m*, an auxiliary power supply 1230 and a buffer memory 1240. The plurality of flash memories 1221 to 122*m* may be connected to the SSD controller 1210** through a plurality of channels, respectively.

The SSD controller 1210 may control a plurality of flash memories 1221 to **122*m* in response to a signal SIG received from the host 1100. The SSD controller 1210 may store a signal (e.g., a signal SIG received from the host 1100) which is internally generated or transmitted from an outside in the buffer memory 1240. The SSD controller 1210 may be implemented as the storage controller 200 described above with reference to FIGS. 1 to 20. For example, the SSD controller 1210 may transmit the command/address CMD/ADDR through different pins from the pins that transmit data DATA in one channel. Using this, the SSD controller 1210** may efficiently perform noise detection by receiving an operating state signal and/or a noise state signal for a way or plane during the input/output operation of data DATA, and may improve the overhead of noise monitoring operations and data input/output operations overlapping.

A plurality of flash memories 1221 to **122*m* may operate under the control of SSD controller 1210. The auxiliary power supply 1230 may be connected to the host 1100 through the power connector 1202. Each of the plurality of flash memories 1221 to 122*m* may be implemented with the non-volatile memory device described above with reference to FIG. 1 to FIG. 20. For example, each of the plurality of flash memories 1221 to 122*m*** may receive a command/address CMD/ADDR through pins different from the pins that receive data DATA.

The auxiliary power supply 1230 may be connected to the host 1100 through the power connector 1202. The auxiliary power supply 1230 may receive power PWR from the host 1100 and charge the power PWR. The auxiliary power supply 1230 may provide power to the SSD 1200 when power supply from the host 1100 is not smooth.

Figure 22:
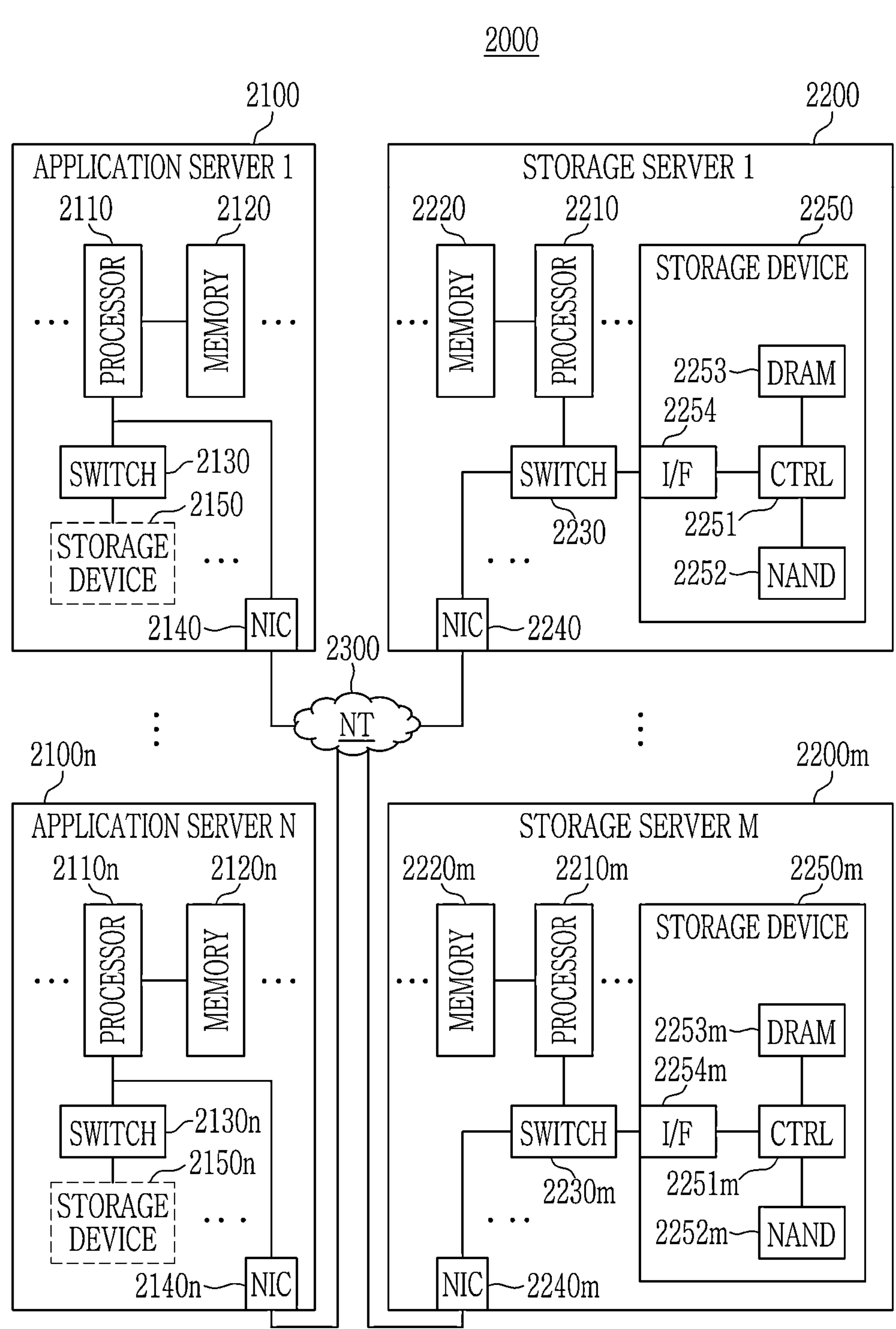
FIG. 22 is a block diagram showing a data center to which a storage device is applied according to an example embodiment.

FIG. 22 is a block diagram showing a data center to which a storage device is applied according to an example embodiment. Referring to FIG. 22, a network system 2000 is a facility that collects various data and provides services, and may be referred to as a data center or data storage center. The network system 2000 may include application servers 2100 to **2100*n* and storage servers 2200 to 2200*m*, and the application servers 2100 to 2100*n* and the storage servers 2200 to 2200*m* may be referred to as computing nodes. The number of application servers 2100 to 2100*n* and the number of storage servers 2200 to 2200*m* may be selected in various manners according to example embodiments, and the number of application servers 2100 to 2100*n* and the number of storage servers 2200 to 2200*m*** may be different.

The application servers 2100 to **2100*n* and the storage servers 2200 to 2200*m* may communicate with each other through a network 2300. The network 2300 may be implemented using a Fibre Channel (FC) or an Ethernet. At this time, FC is a medium used for high-speed data transmission, and an optical switch that provides high performance/high availability may be used. According to an access method of the network 2300, the storage servers 2200 to 2200*m*** may be provided as a file storage, block storage, or object storage.

In an example embodiment, the network 2300 may be a storage-specific network, such as a Storage Area Network SAN. For example, the SAN may be an FC-SAN using an FC network and may be implemented according to the FC Protocol FCP. In an example embodiment, the SAN may be an IP-SAN using a TCP/IP network and may be implemented according to an SCSI over TCP/IP or internet SCSI (iSCSI) protocol. In an example embodiment, network 2300 may be a general network such as a TCP/IP network. For example, the network 2300 may be implemented according to protocols such as FC over Ethernet (FCoE), Network Attached Storage (NAS) and NVMe over Fabrics (NVMe-oF).

Hereinafter, the explanation will be mainly described on an application server 2100 and a storage server 2200. The description of the application server 2100 may also be applied to other application servers **2100*n*, and the description of the storage server 2200 may also be applied to other storage servers 2200*m***.

The application server 2100 may include a processor 2110 and a memory 2120. The processor 2110 may control the overall operation of the application server 2100 and may access the memory 2120 to execute instructions and/or data loaded in the memory 2120. According to an example embodiment, the number of processors 2110 and memories 2120 included in the application server 2100 may be selected in various manners. In an example embodiment, the processor 2110 and the memory 2120 may be configured as a processor-memory pair. In an example embodiment, the numbers of processors 2110 and the numbers of memory 2120 may be configured differently.

The application server 2100 may further include a storage device 2150. At this time, the number of storage devices 2150 included in the application server 2100 may be selected in various manners according to example embodiments. The processor 2110 may provide a command to the storage device 2150, and the storage device 2150 may operate in response to the command received from the processor 2110. However, the present inventive concepts are not limited to thereto, and the application server 2100 may not include the storage device 2150.

The application server 2100 may further include a switch 2130 and a network interface card (NIC) 2140. The switch 2130 may selectively connect the processor 2110 and the storage device 2150 or may selectively connect an NIC 2140 and the storage device 2150 according to the control of the processor 2110. The NIC 2140 may include a wired interface, a wireless interface, a bluetooth interface, an optical interface, etc. In an example embodiment, the processor 2110 and the NIC 2140 may be integrated into one. In an example embodiment, storage device 2150 and NIC 2140 may be integrated into one.

The application server 2100 may store data requested by a user or client to one of the storage servers 2200 to 2200*m* through the network 2300. Additionally, the application server 2100 may obtain a data read requested by a user or client from one of the storage servers 2200 to 2200*m* through the network 2300. For example, the application server 2100 may be implemented as a web server, a database management system (DBMS), etc.

The application server 2100 may access a memory 2120*n* or a storage device 2150*n* included in other application server 2100*n* through the network 2300, or may access memories 2220 and 2220*m* or storage devices 2250 and 2250*m* included in storage servers 2200 and 2200*m* through the network 2300. Accordingly, an application server 2100 may perform various operations on the data stored in application servers 2100 and 2100*n* and/or storage servers 2200 and 2200*m*. For example, the application server 2100 may execute instructions to move or copy data between the application servers 2100 and 2100*n* and/or the storage servers 2200 and 2200*m*. In this case, a data may be moved through the network 2300 in an encrypted state for security or privacy.

The storage server 2200 may include a processor 2210 and a memory 2220. A processor 2210 may control an overall operation of a storage server 2200 and may access a memory 2220 to execute instructions and/or data loaded into the memory 2220. According to example embodiments, the number of processors 2210 and the number of memories 2220 included in the storage server 2200 may be selected in various manners. In an example embodiment, the processor 2210 and the memory 2220 may be configured as a processor-memory pair. In an example embodiment, the numbers of processors 2210 and the numbers of memories 2220 may be configured differently.

The processor 2210 may include a single core processor or multiple core processors. For example, the processor 2210 may include a general-purpose processor, a central processing unit (CPU), a graphics processing unit (GPU), a digital signal processor (DSP), a microcontroller (MCU), a microprocessor, a network processor, an embedded processor, and a field programmable gate array (FPGA), an application-specific instruction set processor (ASIP), an application-specific integrated circuit processor (ASIC), etc.

The storage server 2200 may further include at least one storage device 2250. The number of storage devices 2250 included in the storage server 2200 may be selected in various manners according to the embodiment. The storage device 2250 may include a controller (CTRL) 2251, a NAND flash (NAND) 2252, a DRAM 2253 and an interface (I/F) 2254. Hereinafter, the configuration and operation of the storage device 2250 will be described in detail. The following description of the storage device 2250 may also be applied to other storage devices 2150, 2150*n* and 2250*m*.

An interface 2254 may provide a physical connection between the processor 2210 and a controller 2251 and a physical connection between an NIC 2240 and the controller 2251. For example, the interface 2254 may be implemented in a direct attached storage DAS method that directly connects the storage device 2250 with a dedicated cable. In addition, for example, interface 2254 supports may be implemented in various interface methods such as Advanced Technology Attachment (ATA), Serial ATA (SATA), external SATA (e-SATA), Small Computer Small Interface (SCSI), Serial Attached SCSI (SAS), and Peripheral Component Interconnection (PCI), PCI express (PCIe), NVM express (NVMe), IEEE 1394, universal serial bus (USB), secure digital (SD) card, multi-media card (MMC), embedded multi-media card (eMMC) and compact flash (CF) card interface.

The controller 2251 may control overall operation of the storage device 2250. The controller 2251 may program a data into a NAND flash 2252 in response to a program command, or may read a data from the NAND flash 2252 in response to a read command. For example, the program command and/or read command may be provided by a processor 2210 in the storage server 2200. The program command and/or read command may be provided through the processor 2210 from a processor 2210*m* in other storage server 2200*m* or from processors 2110, 2110*n* in application servers 2100, 2100*n*, or may be directly provided.

The NAND flash 2252 may include a plurality of NAND flash memory cells. However, the present inventive concepts are not limited to this, and the storage device 2250 may include a non-volatile memory, for example, resistive RAM (ReRAM), phase change RAM (PRAM), magnetic RAM (MRAM), a magnetic storage media or optical storage media, etc. other than the NAND flash 2252.

A dynamic RAM (DRAM) 2253 may be used as a buffer memory. For example, the DRAM 2253 may be a double data rate synchronous DRAM (DDR SDRAM), a low power DDR (LPDDR) SDRAM, a graphics DDR (GDDR) SDRAM, a Rambus DRAM (RDRAM) or a high bandwidth memory (HBM). However, the present inventive concepts are not limited to thereto, and the storage device 2250 may use a volatile memory or non-volatile memory, as a buffer memory, other than DRAM. The DRAM 2253 may temporarily store (buffering) data to be written to the NAND flash 2252 or data read from the NAND flash 2252.

The storage server 2200 may further include a switch 2230 and a NIC 2240. The switch 2230 may selectively connect the processor 2210 and the storage device 2250, or may selectively connect the NIC 2240 and the storage device 2250 according to the control of the processor 2210. In an example embodiment, the processor 2210 and the NIC 2240 may be integrated into one. In an example embodiment, the storage device 2250 and the NIC 2240 may be integrated into one.

Storage devices 2150, 2150*n*, 2250 and 2250*m* may correspond to the storage device described above referring to FIG. 1 to FIG. 20. For example, the controller 2251 may transmit a command/address CMD/ADDR to the NAND flash 2252 in response to a request provided from one of the processors 2110, 2110*n*, 2210, 2110*n*. The controller 2251 may transmit the command/address CMD/ADDR through pins different from the pins that transmit data DATA. Using this, the controller 2251 may receive the operating state signal and/or the noise state signal for the way or plane within the NAND flash 2252 during an input/output operation of data DATA, and may efficiently perform noise detection to improve the overhead where a noise monitoring operation and a data input/output operation overlap.

Any functional blocks shown in the figures and described above may be implemented in processing circuitry such as hardware including logic circuits, a hardware/software combination such as a processor executing software, or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

Although some example embodiments have been described in detail above, the scope of the present inventive concepts is not limited to the disclosed example embodiment, and various modifications and improvements can be made to the disclosed example embodiments by a person of an ordinary skill in the art without materially departing from the spirit or scope of the present inventive concepts defined by the claims and their equivalents.

What is claimed is:

1. A non-volatile memory device comprising:
- a data pin configured to output a data signal; and
- a command address pin being separate from the data pin, the command address pin configured to,
  - (i) receive a read command corresponding to the data signal, and
  - (ii) output a noise state data through the command address pin during a data output operation in which the data signal is output through the data pin in response to the read command.

2. The non-volatile memory device of claim 1, wherein
- the command address pin is configured to receive a noise monitoring command for the noise state data after receiving the read command and output the noise state data in response to the noise monitoring command.

3. The non-volatile memory device of claim 2, further comprising:
- a register unit configured to temporarily store a noise index value for the noise state data,
- wherein the non-volatile memory device is configured to output the noise state data based on the noise index value in response to the noise monitoring command.

4. The non-volatile memory device of claim 3, wherein
- the noise state data comprises a flag bit corresponding to a noise detection status.

5. The non-volatile memory device of claim 1, further comprising:
- a memory cell array including a first plane and a second plane different from the first plane,
- a first page buffer corresponding to the first plane,
- a second page buffer corresponding to the second plane, and
- a control logic configured to collect the noise state data for the first plane and the second plane.

6. The non-volatile memory device of claim 5, wherein
- the noise state data comprises a first noise state data for the first plane and a second noise state data for the second plane.

7. The non-volatile memory device of claim 6, wherein
- the first page buffer is configured to perform the data output operation through the data pin, and
- a read operation is performed in the second plane.

8. The non-volatile memory device of claim 6, wherein
- the control logic is configured to output at least one of the first noise state data and the second noise state data to the command address pin during the data output operation.

9. The non-volatile memory device of claim 6, wherein
- the control logic is configured to perform a noise detection operation on a first core voltage applied to the first page buffer and on a second core voltage applied to the second page buffer, and generate the first noise state data and the second noise state data.

10. The non-volatile memory device of claim 1, wherein
- the non-volatile memory device is configured to perform the data output operation within a range of 10 us to 900 us, and
- the non-volatile memory device is configured to perform an output operation for the noise state data within a range of 10 ns to 900 ns.

11. A storage device comprising:
- a first non-volatile memory device and a second non-volatile memory device connected to a first channel, the first non-volatile memory device and the second non-volatile memory device configured to perform a data input/output operation through the first channel; and
- a storage controller configured to
  - provide a data input/output command for the data input/output operation to the first non-volatile memory device through a command address pin connected to the first channel,
  - perform the data input/output operation for the first non-volatile memory device through a data pin connected to the first channel, the data pin being different from the command address pin, and
  - receive a noise state data on at least one of the first and the second non-volatile memory devices in parallel with the data input/output operation through the command address pin.

12. The storage device of claim 11, wherein
- the storage controller is further configured to output a noise monitoring command requesting the noise state data based on a ready/busy map, the ready/busy map including a first ready/busy state data for the first non-volatile memory device and a second ready/busy state data for the second non-volatile memory device.

13. The storage device of claim 12, wherein
- the second ready/busy state data is configured to be updated through the command address pin during the data input/output operation.

14. The storage device of claim 12, wherein
- the first non-volatile memory device is configured to perform the data output operation within a range of 10 us to 900 us, and
- the second non-volatile memory device is configured to output the second ready/busy state data within a range of 10 ns to 900 ns.

15. The storage device of claim 11, wherein
- when the first non-volatile memory device performs the data input/output operation and the second non-volatile memory device is in a busy state,
- the storage controller is configured to output a noise monitoring command for the noise state data through the command address pin.

16. The storage device of claim 15, wherein the storage controller is configured to provide the noise monitoring command to the second non-volatile memory device.

17. An operation method of a storage device comprising:

providing a data input/output command through a command address pin;

performing a data input/output operation through a data pin different from the command address pin based on the data input/output command;

providing a noise monitoring command through the command address pin according to a condition during the data input/output operation; and receiving a noise state data through the command address pin in response to the noise monitoring command during the data input/output operation.

18. The operation method of the storage device of claim 17, further comprising:

verifying the data input/output operation in response to the noise state data.

19. The operation method of claim 17, wherein the condition is that a plurality of non-volatile memory devices are connected to one channel to which the command address pin and the data pin are connected, a first non-volatile memory device among the plurality of non-volatile memory devices performs the data input/output operation, and the plurality of non-volatile memory devices except the first non-volatile memory device are in a busy state.

20. The operation method of claim 17, wherein the condition is that a plurality of planes are connected to one channel to which the command address pin and the data pin are connected, a first plane among the plurality of planes performs the data input/output operation, and the plurality of planes except the first plane are in a busy state.

* * * * *